US008545991B2

(12) United States Patent  
Johnson et al.

(10) Patent No.: US 8,545,991 B2  
(45) Date of Patent: Oct. 1, 2013

(54) LOW THERMAL CONDUCTIVITY MISFIT LAYER COMPOUNDS WITH LAYER TO LAYER DISORDER

(75) Inventors: David C. Johnson, Eugene, OR (US); Ngoc T. Nguyen, Eugene, OR (US); Qiyin Lin, Darien, IL (US); Colby L. Heideman, Springfield, OR (US); Clay Mortensen, Portland, OR (US)

(73) Assignee: State of Oregon Acting by and Through the State Board of Higher Education on Behalf of the University of Oregon, Eugene, OR (US)

( * ) Notice: Subject to any disclaimer, the term of this patent is extended or adjusted under 35 U.S.C. 154(b) by 404 days.

(21) Appl. No.: 12/693,376

(22) Filed: Jan. 25, 2010

(65) Prior Publication Data

US 2010/0233454 A1    Sep. 16, 2010

Related U.S. Application Data

(60) Provisional application No. 61/147,017, filed on Jan. 23, 2009.

(51) Int. Cl.
*B32B 33/00* (2006.01)

(52) U.S. Cl.
USPC ........................................................ 428/635

(58) Field of Classification Search
None
See application file for complete search history.

(56) References Cited

U.S. PATENT DOCUMENTS

| 3,362,853 A | 1/1968 | Valdsaar |
| 5,198,043 A | 3/1993 | Johnson |
| 5,900,071 A | 5/1999 | Harman |
| 5,994,639 A | 11/1999 | Johnson |
| 2003/0099279 A1 | 5/2003 | Venkatasubramanian et al. |
| 2003/0110892 A1 | 6/2003 | Nicoloau |
| 2004/0107988 A1 | 6/2004 | Harman et al. |
| 2005/0150539 A1 | 7/2005 | Ghoshal et al. |
| 2006/0097241 A1* | 5/2006 | Harris et al. ..................... 257/9 |
| 2006/0107891 A1 | 5/2006 | Zurbuchen |

FOREIGN PATENT DOCUMENTS

| CA | 2589107 | 6/2006 |
| DE | 29916723 | 9/1999 |
| DE | 10047465 | 3/2000 |

(Continued)

OTHER PUBLICATIONS

Wiegers et al., Misfit layer Compounds (MS)nTS2 (M = Sn, Pb, Bi, Rare Earth Metals; T = Nb, Ti, V, Cr; 1.08 < n < 1.23) : Structures and Physical Properties, Materials Science Forum vols. 100-101 (1992) pp. 101-172.*

(Continued)

*Primary Examiner* — Jennifer Chriss  
*Assistant Examiner* — Adam Krupicka  
(74) *Attorney, Agent, or Firm* — Klarquist Sparkman, LLP

(57) ABSTRACT

Compositions comprise an alternating plurality of ordered layers of a first composition MX and a second composition $TX_2$, wherein M is one of Sn, Pb, Sb, Bi, or a rare earth metal, X is S or Se and T is Ti, V, Cr, Nb, or Ta. In some examples, the alternating plurality of ordered layers conforms to a substrate. In typical examples, each of the ordered layers of the first composition has a common thickness and/or each of the ordered layers of the first material has a common composition. In some examples, each of the ordered layers of the second composition has a common thickness and/or a common composition.

28 Claims, 22 Drawing Sheets

(56) References Cited

FOREIGN PATENT DOCUMENTS

| WO | WO01/17035 | 3/2001 |
| WO | WO2004/012263 | 2/2004 |
| WO | WO2006/005126 | 1/2006 |
| WO | WO2006/058782 | 6/2006 |
| WO | WO/2007/047928 | 4/2007 |

OTHER PUBLICATIONS

Billinge et al., "Beyond Crystallography: The Study of Disorder, Nanocrystallinity and Crystallographically Challenged Materials with Pair Distribution Functions," Chem. Commun., 7:749-760, 2004.

Böttner et al., "Aspects of Thin-Film Superlattice Thermoelectric Materials, Devices, and Applications," MRS Bulletin, 31:211-217, 2006.

Costescu et al., "Ultra-Low Thermal Conductivity in W/Al2O3 Nanolaminates," Science, 303:989-990, 2004.

Harris et al., "Turbostratic Disorder in [(Bi2Te3)X(TiTe2)y] Superlattices," Mat. Res. Soc. Symp. Proc., 793:29-34, 2004.

International Preliminary Report on Patentability from PCT/US2006/041046, mailed Mar. 24, 2009.

International Search Report and Written Opinion of the International Searching Authority from PCT/US2006/041046, mailed May 15, 2008.

Noh et al., "Designed Synthesis of [TiSe2]m[NbSe2]n Superlattices from Modulated Reactants," Agnew. Chem. Int. Ed. Engl., 35(22):2666-2669, (Dec. 1996).

Shelimova et al., "Crystal Structure and Thermoelectric Properties of the Mixed Layered Compounds of the (GeTe)n(Bi2Te3)m Homologous Series," 16th International Conference on Thermoelectrics, 481-484, 1997.

Touzelbaev et al., "Thermal Characterization of Bi2Te3/Sb2Te3 Superlattices," Juranl of Applied Phusics, 90(2):763-767 (Jul. 15, 2001).

Harris, et al., "The Synthesis of $[(Bi_2Te_3)x\{(TiTe_2)y\}_{1.36}]$ Superlattices from Modulated Elemental Reactants," *J. Am. Chem. Soc.* 127:7843-7848 (2005).

Heideman, et al., "The synthesis and characterization of new $[(BiSe)_{1.10}]m[NbSe_2]n$, $[(PbSe)_{1.10}]m[NbSe_2]n$, $[(CeSe)_{1.14}]m[NbSe_2]n$ and $[(PbSe)_{1.12}]m[TaSe_2]n$ misfit layered compounds," *Journal of Solid State Chemistry*, 2008, 6 pages.

Heideman, "Design in Solid State Chemistry," Misfit Layered Compounds, presentation at Southern Utah University, Jan. 2007, 22 pages.

Heideman et al., "An expedition through chemical landscapes: misfit layered compounds," University of Oregon Chemistry Department, Jun. 2007, 25 pages.

Heideman, et al., "Rational Design of Misfit Layered Compounds," *Gordon Conference*, Jul. 2006, 1 page.

Li et al., "Attempted Synthesis of $(Bi_2Te_3)_x (SnTe)_y$ Misfit Layer Compounds," *2005 24th International Conference on Thermoelectrics (ICT)* pp. 287-288 (2005).

Lin et al., "Designed Synthesis of Families of Misfit Layered Compounds," *Materials Sciences Institute Retreat*, Dec. 2008, 25 pages.

Lin et al., "Designed Synthesis of Families of Misfit Layered Compounds," *Poster Presentation*, Mar. 2007, 1 page.

Wiegers, "Misfit Layer Compounds: Structures and Physical Properties," *Prog. Solid St. Chem.* 24:1-139 (1996).

\* cited by examiner

| BiSe bilayers | NbSe$_2$ layers | Unit cell thickness (Å) |
| --- | --- | --- |
| 1 | 1 | 12.047(8) |
| 1 | 2 | 18.5 (2) |
| 1 | 3 | 25.1(3) |
| 1 | 4 | 30.9(2) |
| 1 | 5 | 37.37(5) |
| 3 | 1 | 22.11(3) |
| 3 | 3 | 35.07(3) |
| 4 | 1 | 27.75(4) |
| 4 | 2 | 34.08(9) |
| 5 | 3 | 46.2(5) |
| 5 | 5 | 59.1(4) |
| 6 | 1 | 37.5(1) |
| 6 | 1 | 37.33(3) |
| 6 | 2 | 43.79(4) |
| 6 | 3 | 50.09(8) |
| 6 | 4 | 56.73(5) |
| 6 | 5 | 63.0(3) |
| 7 | 4 | 62.0(2) |
| 8 | 1 | 50.73(7) |
| 8 | 4 | 66.21(8) |
| 8 | 4 | 66.2(2) |
| 9 | 3 | 69.6(3) |
| 10 | 4 | 76.4(3) |
| 11 | 3 | 78.9(2) |
| 11 | 4 | 82.5(2) |
| 13 | 4 | 90.6(2) |
| 14 | 4 | 99.2(2) |
| 15 | 4 | 103.5(4) |

FIG. 6

| m | n | Unit cell thickness (Å) |
|---|---|---|
| $[(CeSe)_{1.14}]_m[NbSe_2]_n$ | | |
| 2.5 | 4 | 39.5(1) |
| 2.5 | 6 | 52.3(1) |
| 2.5 | 8 | 65.2(2) |
| 2.5 | 10 | 77.9(1) |
| 1 | 8 | 56.5(1) |
| 2.5 | 8 | 65.1(4) |
| 4 | 8 | 73.5(2) |
| 1 | 4 | 31.5(6) |
| 2.5 | 4 | 39.6(1) |
| 4 | 4 | 48.0(2) |
| $[(PbSe)_{1.12}]_m[TaSe_2]_n$ | | |
| 1 | 1 | 12.49(1) |
| 1 | 2 | 18.95(3) |
| 1 | 5 | 38.13(6) |
| 2 | 1 | 18.61(1) |
| 2 | 2 | 25.05(5) |
| 2 | 3 | 31.45(5) |
| 2 | 4 | 37.80(6) |
| 3 | 1 | 24.73(7) |
| 3 | 2 | 31.50(8) |
| 3 | 3 | 37.51(5) |
| 4 | 4 | 49.8(2) |
| $[(PbSe)_{1.10}]_m[NbSe_2]_n$ | | |
| 1 | 1 | 12.439(7) |
| 1 | 2 | 18.82(2) |
| 1 | 3 | 25.2(2) |
| 1 | 5 | 37.8(2) |
| 2 | 1 | 18.57(4) |
| 3 | 1 | 24.7(3) |
| 2 | 2 | 24.9(1) |

FIG. 8

| Compound | Resistivity (Ω m) |
|---|---|
| [(PbSe)$_{1.10}$]$_1$[NbSe$_2$]$_1$ | 6.80E-06 |
| [(PbSe)$_{1.10}$]$_1$[NbSe$_2$]$_2$ | 5.63E-06 |
| [(PbSe)$_{1.10}$]$_1$[NbSe$_2$]$_3$ | 5.59E-06 |
| [(PbSe)$_{1.10}$]$_2$[NbSe$_2$]$_1$ | 1.37E-05 |
| [(PbSe)$_{1.10}$]$_3$[NbSe$_2$]$_1$ | 3.68E-05 |
| [(PbSe)$_{1.10}$]$_2$[NbSe$_2$]$_2$ | 3.49E-06 |

| Compound | Seebeck coefficient (μVK$^{-1}$) |
|---|---|
| [(PbSe)$_{1.10}$]$_1$[TaSe$_2$]$_1$ | 61 |
| [(PbSe)$_{1.10}$]$_1$[TaSe$_2$]$_2$ | 36 |
| [(PbSe)$_{1.10}$]$_1$[TaSe$_2$]$_3$ | 25 |
| [(PbSe)$_{1.10}$]$_1$[TaSe$_2$]$_4$ | 23 |

LOW THERMAL CONDUCTIVITY MISFIT LAYER COMPOUNDS WITH LAYER TO LAYER DISORDER

CROSS-REFERENCE TO RELATED APPLICATION

This application claims the benefit of U.S. Provisional Application No. 61/147,017, filed Jan. 23, 2009, which is incorporated herein by reference.

ACKNOWLEDGMENT OF GOVERNMENT SUPPORT

This invention was made with government support under Grant No. N00014-04-1-0407, Grant No. N00014-96-0408, and Grant No. N0014-07-1-0358 awarded by the Office of Naval Research. The government has certain rights in the invention.

FIELD

The disclosure pertains to layered misfit compounds and methods of making such compounds.

BACKGROUND

Misfit layer compounds generally are formed of atomic layers with strong bonding and ordering within each layer, but in which the layers only weakly interact with each other. While several misfit layer compounds are known, the fabrication of misfit layer compounds is difficult, and conventional methods are typically based on heating material constituents in sealed ampoules. The resulting product is usually in the form of a fine powder or small crystals.

These conventional methods are generally unable to produce well controlled structures. In addition, the product tends to be small and irregularly shaped, and thus unsuitable for most applications. For at least these reasons, improved fabrication methods, products, and compositions are needed.

SUMMARY

Compositions comprise an alternating plurality of ordered layers of a first composition MX and a second composition $TX_2$, wherein M is one of Sn, Pb, Sb, Bi, or a rare earth metal, X is S or Se, and T is Ti, V, Cr, Nb, or Ta. In some examples, the alternating plurality of ordered layers conforms to a substrate. In typical examples, each of the ordered layers of the first composition has a common thickness and/or each of the ordered layers of the first material has a common composition. In some examples, each of the ordered layers of the second composition has a common thickness and/or a common composition. In additional examples, at least one ordered layer having a third composition different than the first and the second compositions is situated adjacent a layer having the first composition or the second composition. In representative examples, a silicon substrate is configured to support the alternating plurality of layers and a layer of the first composition or the second composition is situated on a (001) surface of the silicon substrate. In further examples, m layers of the first composition alternate with n layers of the second composition, wherein m and n are positive integers, and in some examples, m and n are less than 10. According to some embodiments, each of the layers has a thickness between about 1 nm and about 200 nm or about 20 nm and about 80 nm. In other examples, the ordered layers have coherence lengths within the layers of at least 2 nm, 5 nm, or 10 nm. In one example, M is Pb, X is Se, T is Se, m=n=1, and an electrical conductivity of the composition is at least 0.04 $Ohm^{-1} \cdot m^{-1}$ and a Seebeck coefficient is at least 100 µV/K. In some examples, the composition may be a layered composition having a thermal conductivity of less than about 0.08 W $m^{-1}K^{-1}$ in a direction perpendicular to an interface between a $TX_2$ layer and an MX layer.

Methods comprise depositing alternating sublayers of a first constituent M and a second constituent X to form a layer having a first composition, wherein M is one of Sn, Pb, Sb, Bi, or a rare earth metal and X is S or Se. Alternating sublayers of a third constituent T and the second constituent X are deposited to form a layer having a second composition, wherein T is Ti, V, Cr, Nb, or Ta. The deposited layers are annealed at a temperature of between about 200° C. and 550° C. so as to form alternating ordered layers of MX and $TX_2$. In some examples, sublayer thicknesses for the sublayers are selected to provide a 1:1 atomic ratio (MX) or a 1:2 atomic ratio ($TX_2$), and the sublayers are deposited so that the deposited thicknesses for each of the sublayers is within about 0.1%, 0.5%, 1%, or 2% of the selected thickness. In other examples, different atomic ratios can be used. In additional examples, m layers of the first and second constituents and n layers of the third and second constituents are alternatingly formed, wherein m and n are positive integers.

BRIEF DESCRIPTION OF THE DRAWINGS

FIG. 6 is a table listing unit cell thickness for additional members of the $[(BiSe)_{1.10}]_m(NbSe_2)_n$ family.

FIG. 8 is a table of unit cell thicknesses for additional misfit layered compounds.

FIG. 11 lists measured in-plane resistivities and room temperature Seebeck coefficients for various layered structures.

FIG. 12B is a graph of reflected X-ray diffraction intensity (I) as a function of angles between 10 and 70 degrees for a

[(BiSe)$_{1.10}$]$_1$(NbSe$_2$) layered compound as a function of annealing temperature. Intensity peaks noted with * vary with sample mounting.

Figure 13:
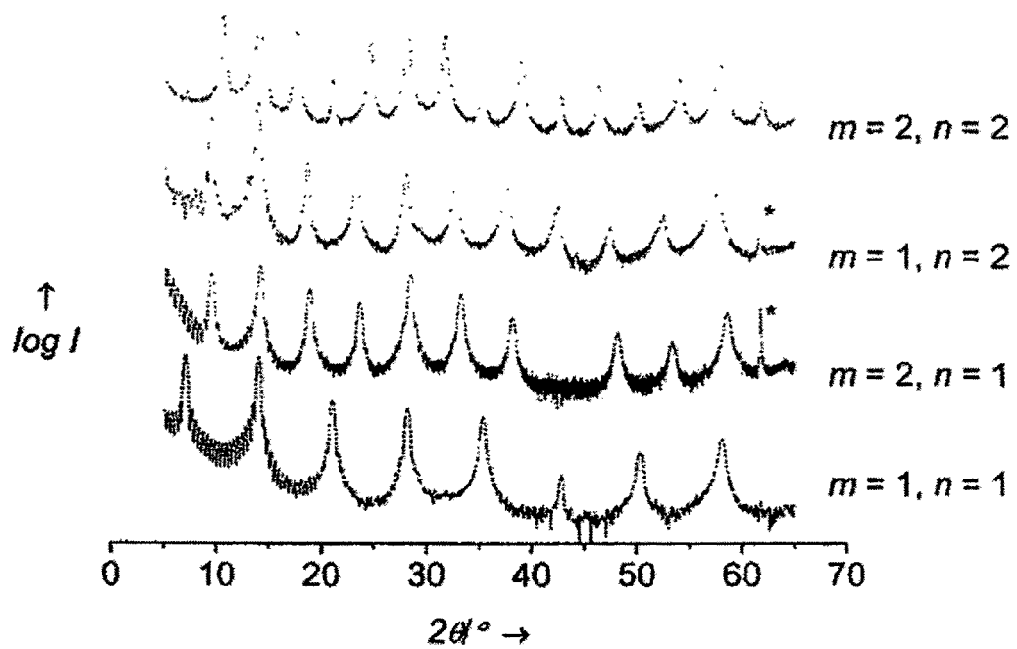

FIG. 13 contains plots of reflected X-ray diffraction intensity (I) as a function of angles between 10 and 70 degrees for four [(PbSe)$_{0.99}$]$_m$(WSe$_2$)$_n$ layered compounds (m=1, 2 and n=1, 2) after annealing for 400 C for one hour. Intensity peaks noted with * are substrate peaks.

Figure 14:
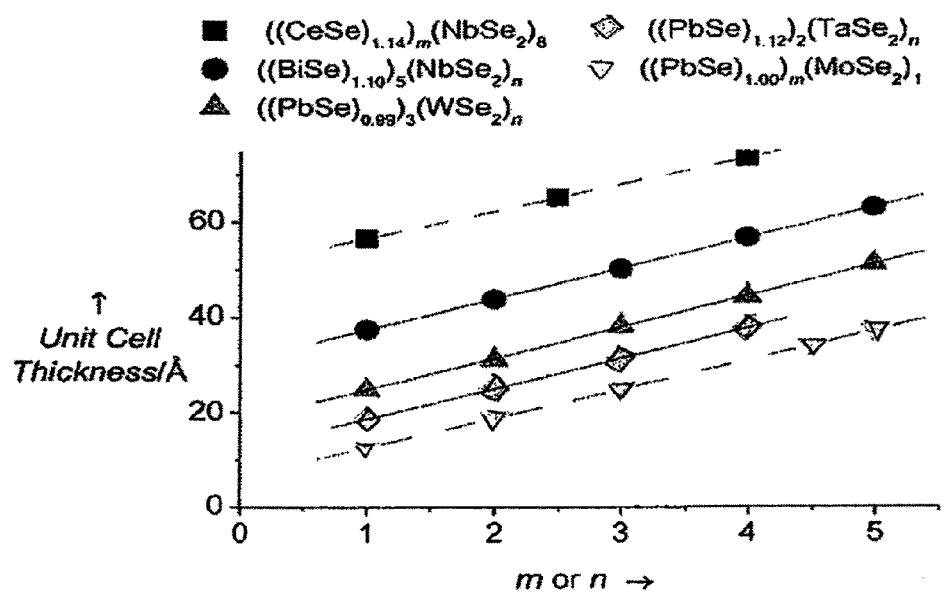

FIG. 14 includes plots of unit cell thickness as a function of numbers of repeat layers for five different compositions. Solid lines indicate increasing numbers of dichalcogenide layers and dashed lines correspond to increasing numbers of rock salt layers. Compositions are [CeSe$_{1.14}$]$_m$(NbSe$_2$)$_8$, [PbSe$_{1.12}$]$_2$(TaSe$_2$)$_n$, [BiSe$_{1.10}$]$_5$(NbSe$_2$)$_n$, [PbSe$_{1.00}$]$_m$(MoSe$_2$)$_1$, and [PbSe$_{0.99}$]$_3$(WSe$_2$)$_n$.

Figure 15A:
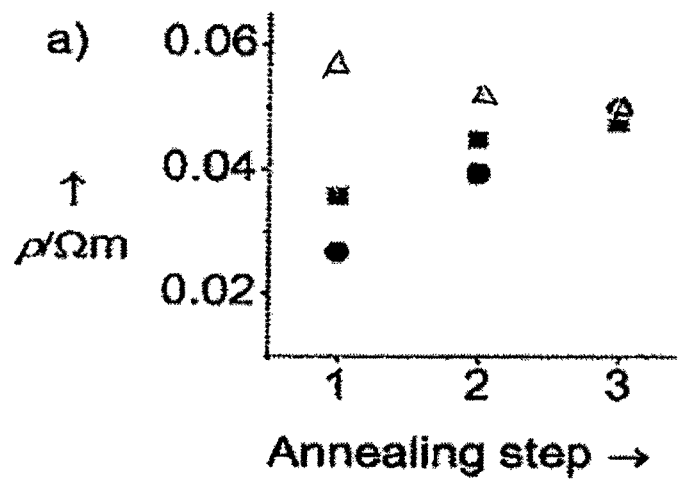
Figure 15B:
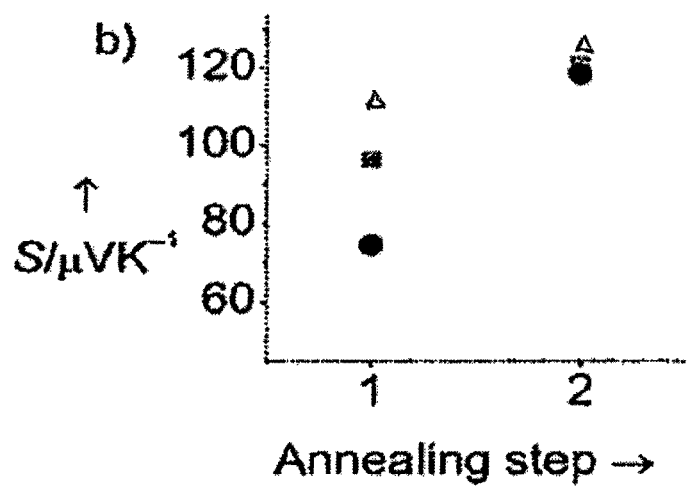

FIGS. 15A-15B are graphs of Seebeck coefficient S (in μV/K) and electrical resistivity ρ (in Ω-m), respectively, for three identical samples of [(PbSe)$_{0.99}$]$_m$(WSe$_2$)$_1$ annealed in open N2 at 400° C. for 1 hr. (squares), in a sealed environment with a Se overpressure at 400° C. (circles), and in a sealed Se environment fat 400° C. for 2 hr.

Figure 16:
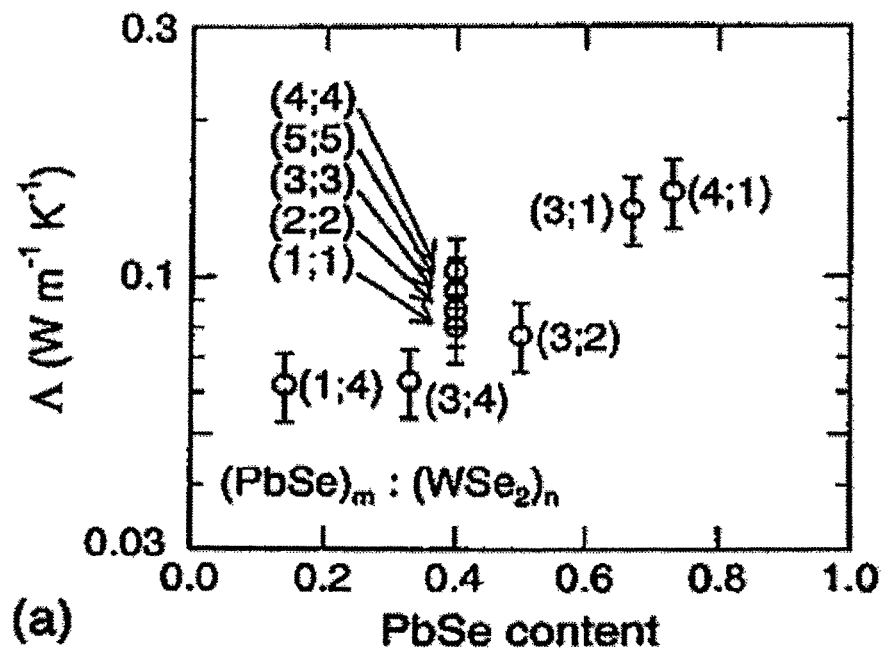
Figure 17:
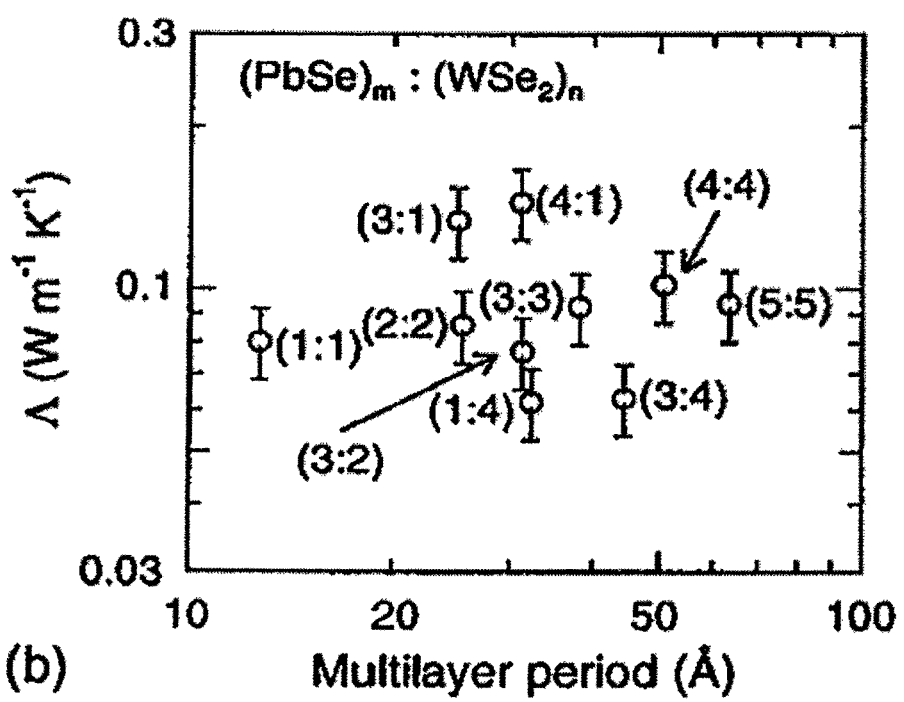

FIGS. 16-17 are graphs of cross-plane thermal conductivity for (PbSe)$_m$(WSe$_2$)$_n$ films plotted as a function of PbSe content (FIG. 16) and as a function of thickness of the multilayer period (FIG. 17). As in other examples, m is a number of PbSe bilayers and n is a number of WSe$_2$ sheets.

Figure 18:
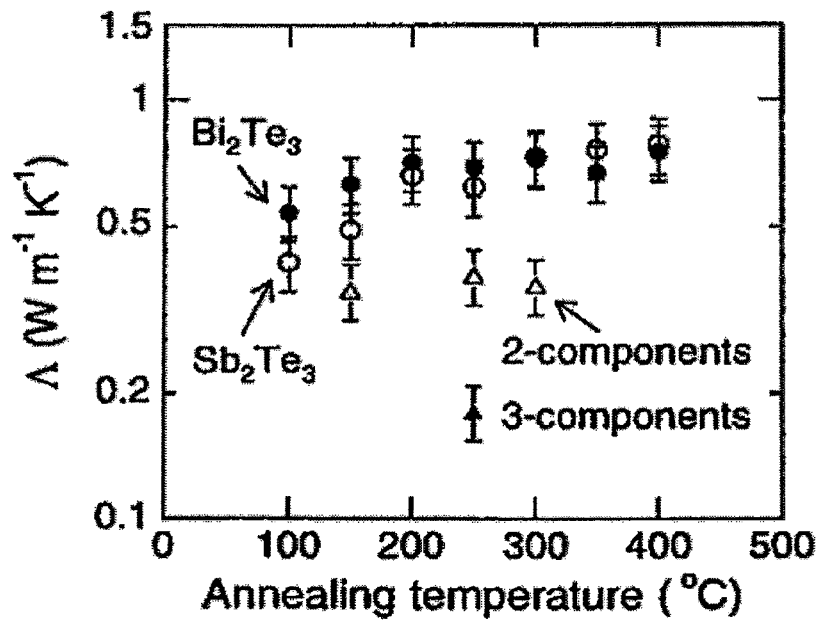

FIG. 18 includes graphs of cross-plane thermal conductivity for two and three component films based on (Bi$_2$Te$_3$) and (Sb$_2$Te$_3$) as a function of annealing temperature.

Figure 19:
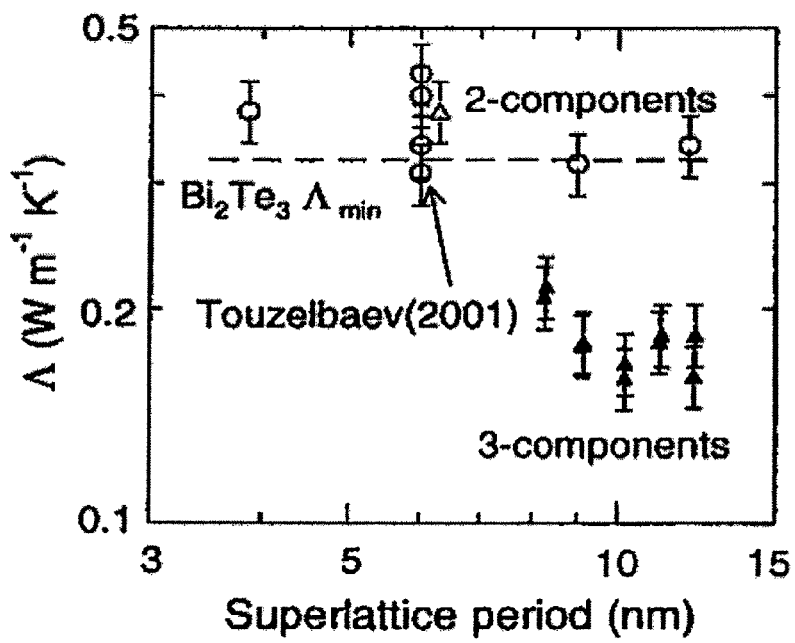

FIG. 19 contains a graph of cross-plane thermal conductivity as a function of superlattice period for three-component multilayers Bi$_2$Te$_3$/TiTe$_2$/Sb$_2$Te$_3$ (filled triangles) and two-component multilayers Bi$_2$Te$_3$/Sb$_2$Te$_3$ (open triangles) for samples annealed at 250° C. A calculated minimum thermal conductivity is shown as a dashed line for comparison. Data for Bi$_2$Te$_3$/Sb$_2$Te$_3$ superlattices is taken from Touzelbaev et al., J. Appl. Phys. 90:763 (2001).

Figure 20:
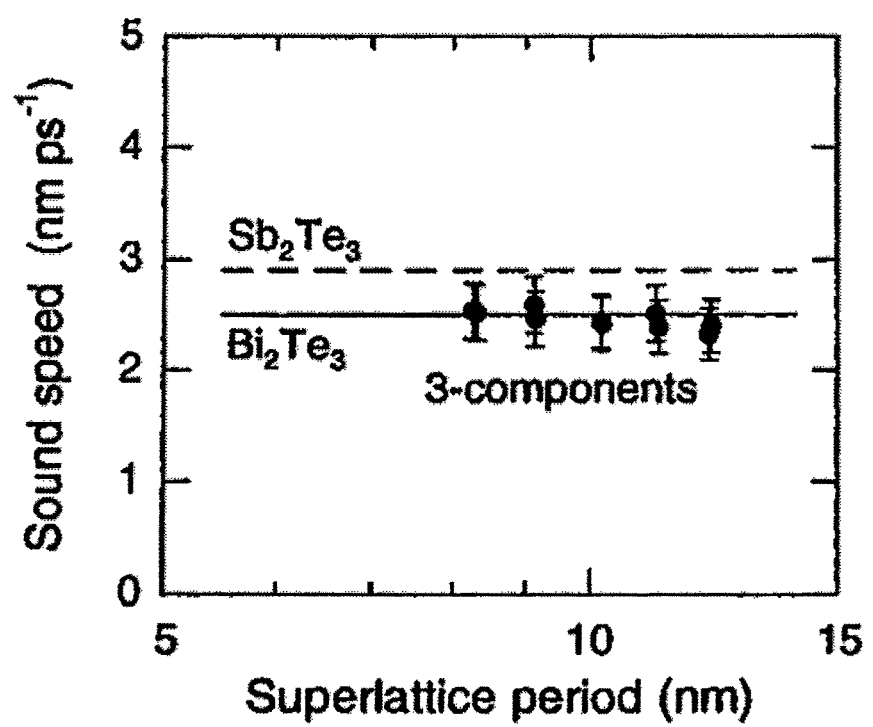

FIG. 20 contains a graph of longitudinal speed of sound for three component Bi$_2$Te$_3$/TiTe$_2$/Sb$_2$Te$_3$ films as a function of superlattice period.

Figure 21:
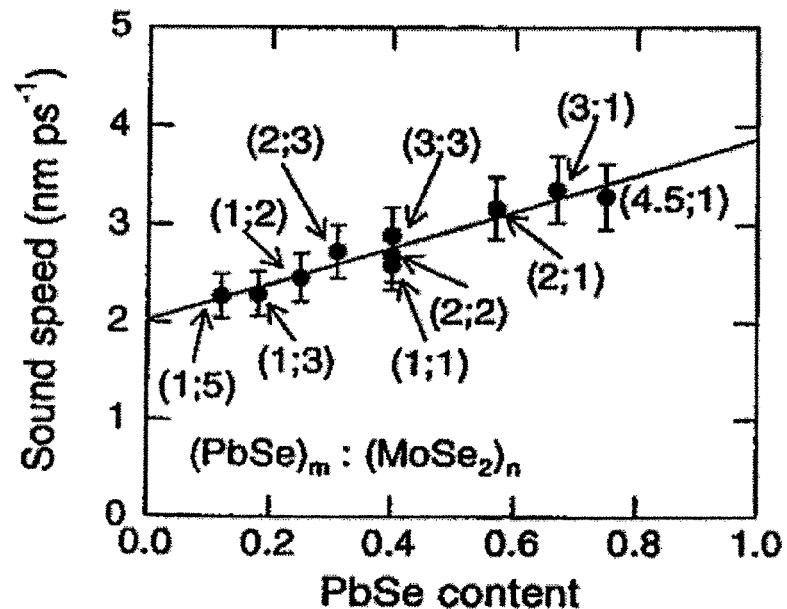
Figure 22:
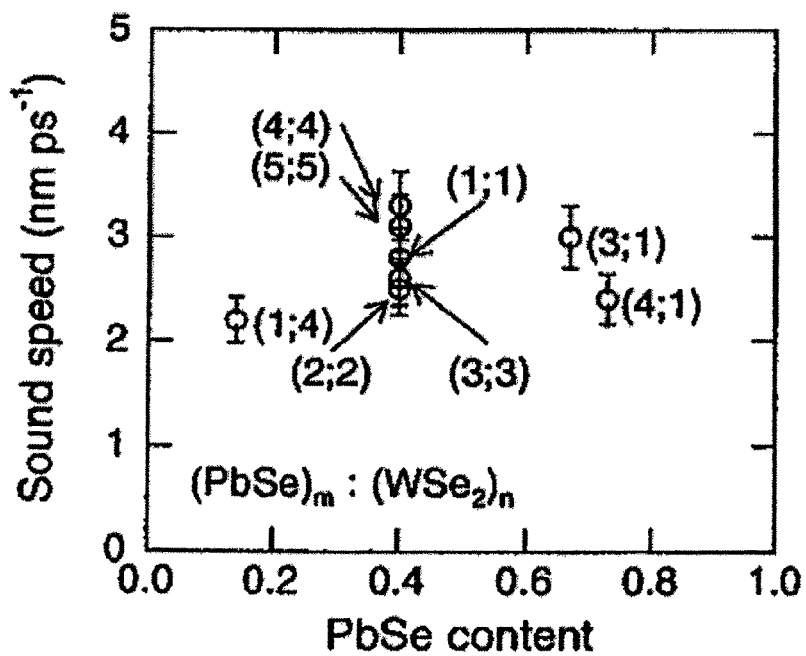

FIGS. 21-22 are graphs of longitudinal speed of sound for (PbSe)$_m$(MoSe$_2$)$_n$ films and (PbSe)$_m$(WSe$_2$)$_n$ films, respectively, as a function of PbSe fraction 2m/(2m+3n).

Figure 23:
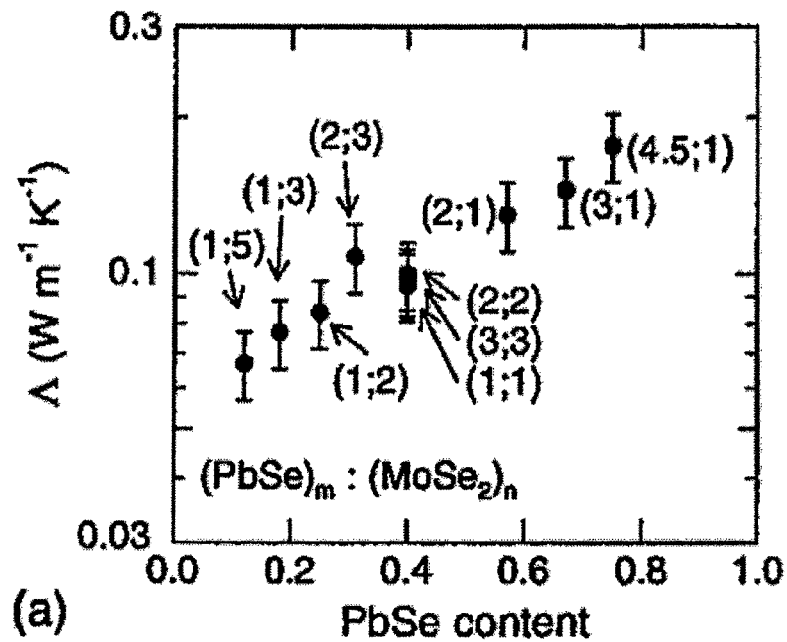
Figure 24:
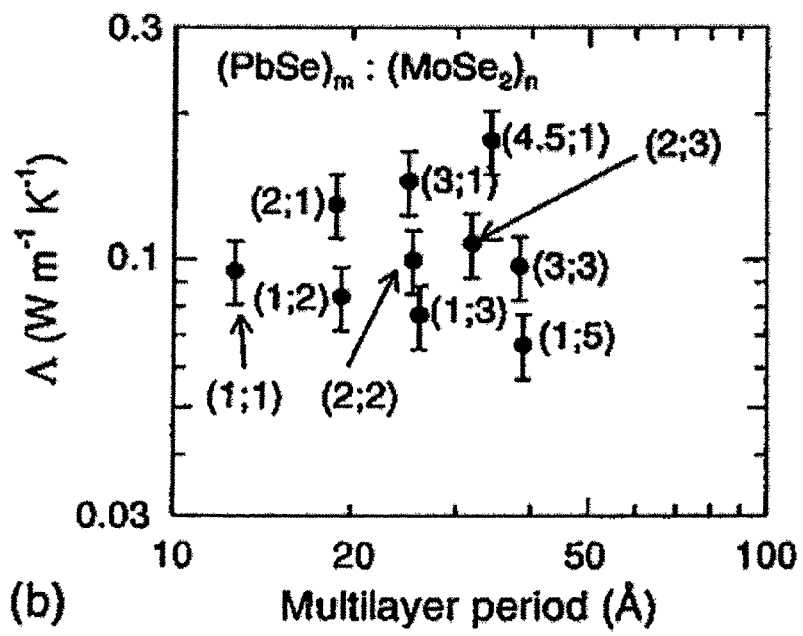

FIGS. 23-24 are graphs of cross-plane thermal conductivity of (PbSe)$_m$(MoSe$_2$)$_n$ films as a function of PbSe atomic fraction 2 m/(2m+3n) (FIG. 23) and thickness of the misfit layer repeat unit (FIG. 24).

Figure 25:
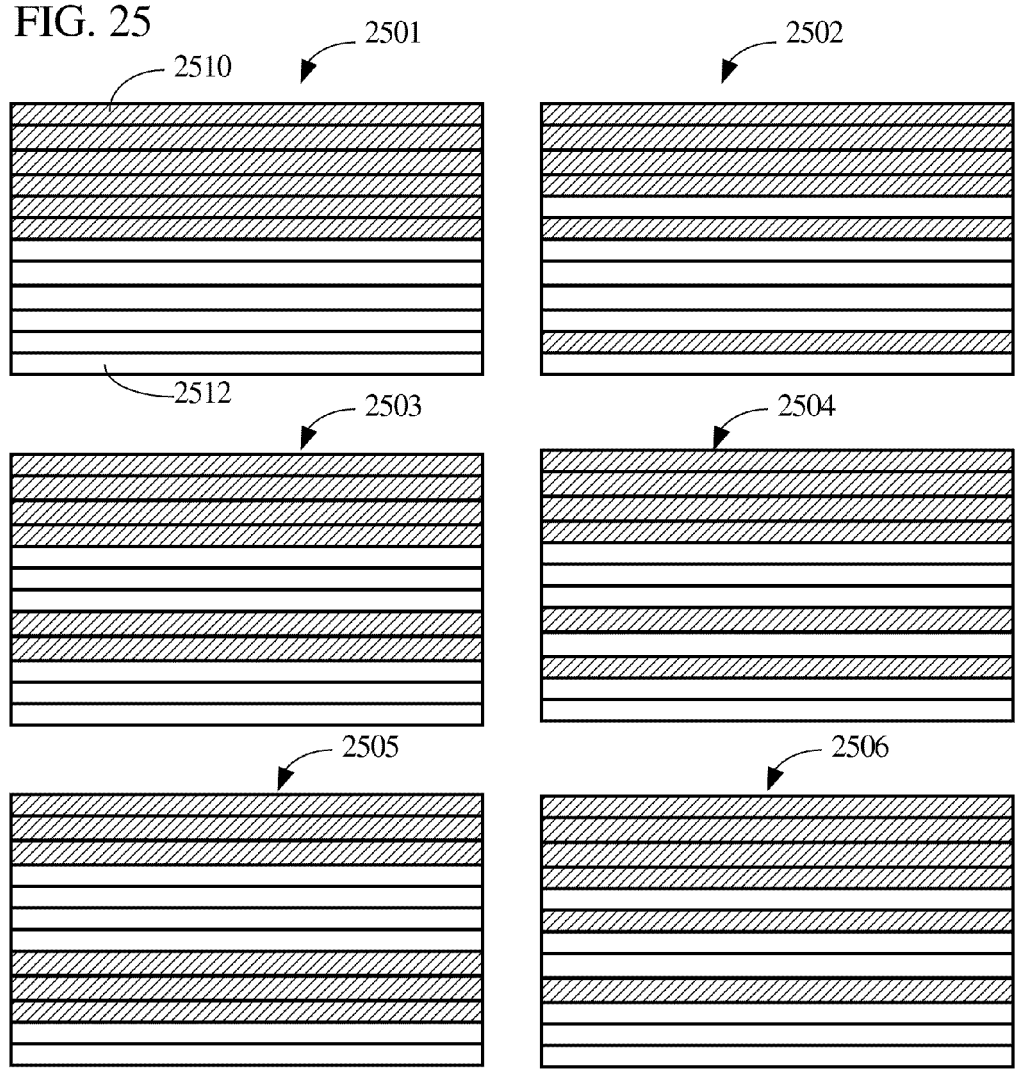
Figure 26:
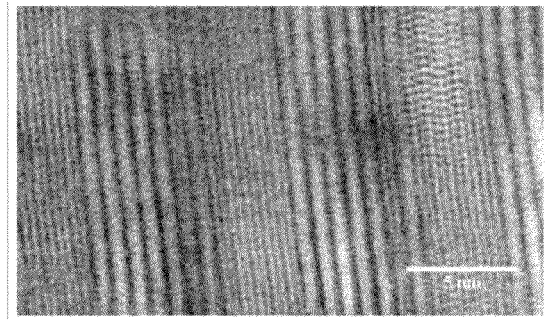

FIG. 25 illustrates representative isomers of a 12 layer structure that include six layers each of a first constituent and a second constituent. I FIG. 26 is an electron microscopic image of a section of one example isomer of a twelve layer structure, (MoSe$_2$)$_5$(PbSe)$_1$(MoSe$_2$)$_1$(PbSe)$_5$.

Figure 27:
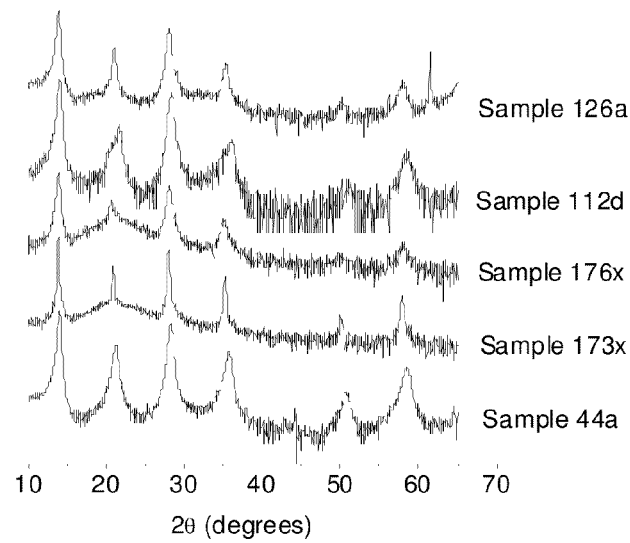

FIG. 27 includes diffraction patterns obtained of five different [(PbSe)$_{1.00}$]$_1$[MoSe$_2$]$_1$ samples. The vertical coordinate is the logarithm of the intensity, which enables weaker Bragg peaks to be more easily seen.

Figure 28:
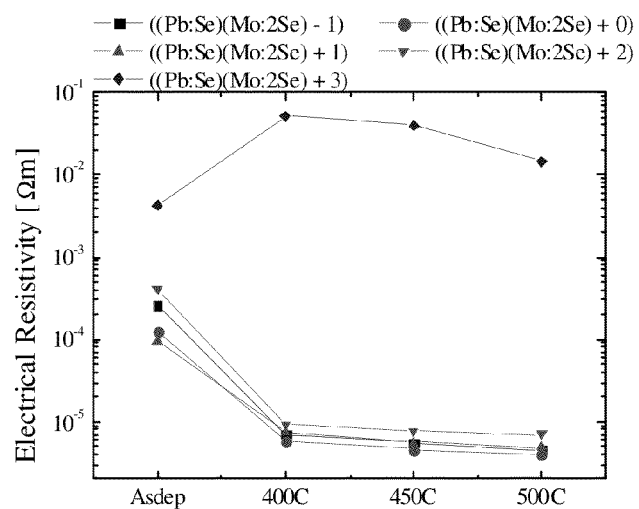
Figure 29:
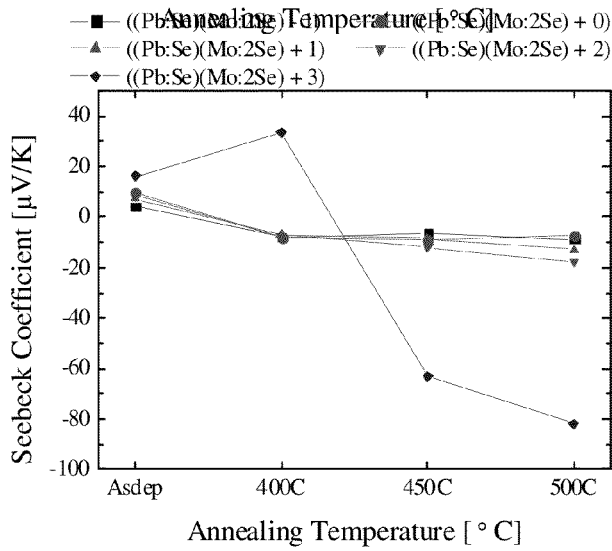

FIGS. 28-29 are plots of Seebeck coefficient and electrical resistivity as a function of annealing temperature in an open system for five different [(PbSe)$_{1.00}$]$_1$[MoSe$_2$]$_1$ samples.

Figure 30:
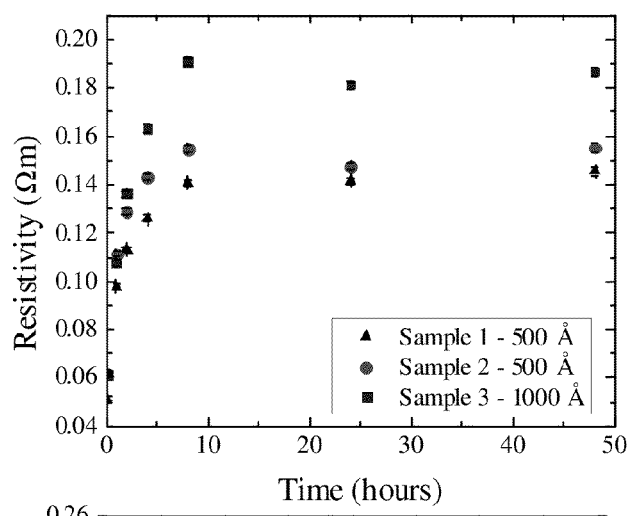

FIG. 30 is a plot of resistivity of [(PbSe)$_{1.00}$]$_1$[MoSe$_2$]$_1$ films annealed in a sealed ampoule with a PbSe vapor source until reaching equilibrium.

Figure 31:
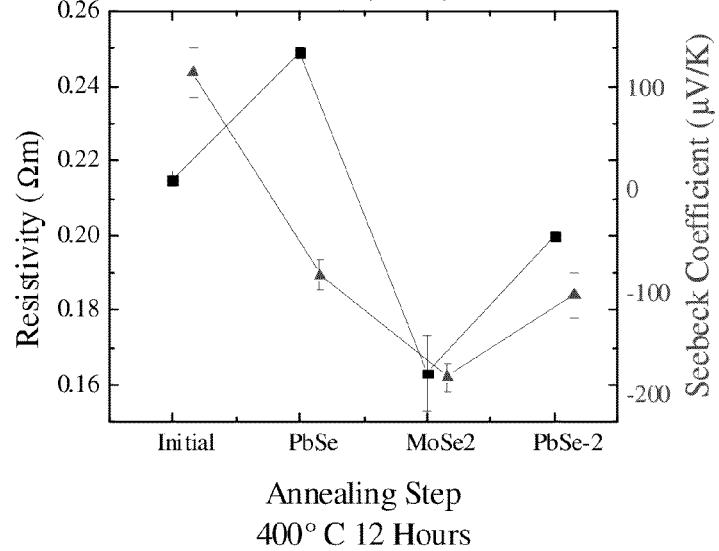

FIG. 31 is a plot illustrating variation in resistivity (■) and Seebeck coefficient (▲) during cyclic annealing of films in PbSe and MoSe$_2$ buffers. Each annealing step was performed at 400° C. for 12 h.

Figure 32:
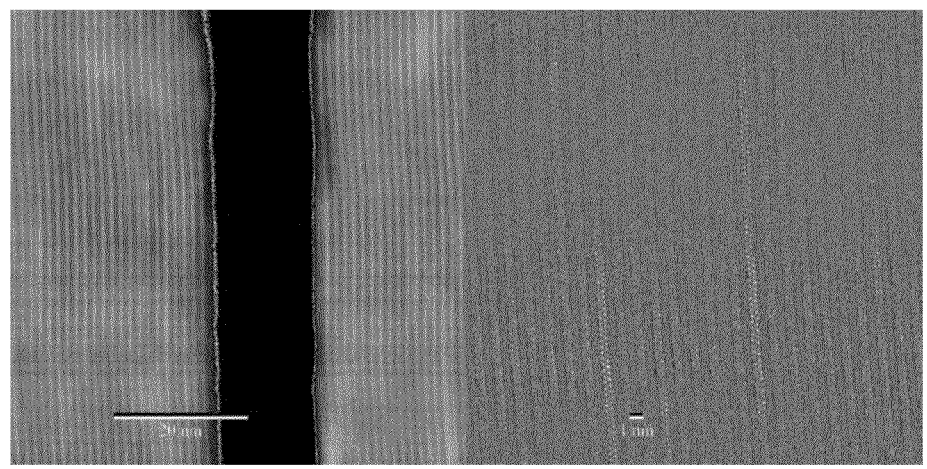

FIG. 32 includes STEM-HAADF images collected on a representative [(PbSe)$_{1.00}$]$_1$[MoSe$_2$]$_1$ sample. The alternating ≈0.6 nm layers of the PbSe and MoSe$_2$ constituents are clearly visible. In the right-hand image, different in-plane orientations of the constituent structural units are apparent, as different zone axes of the PbSe layers are visible in different layers. Most layers are not orientated along a low-index zone axis.

Figure 33:
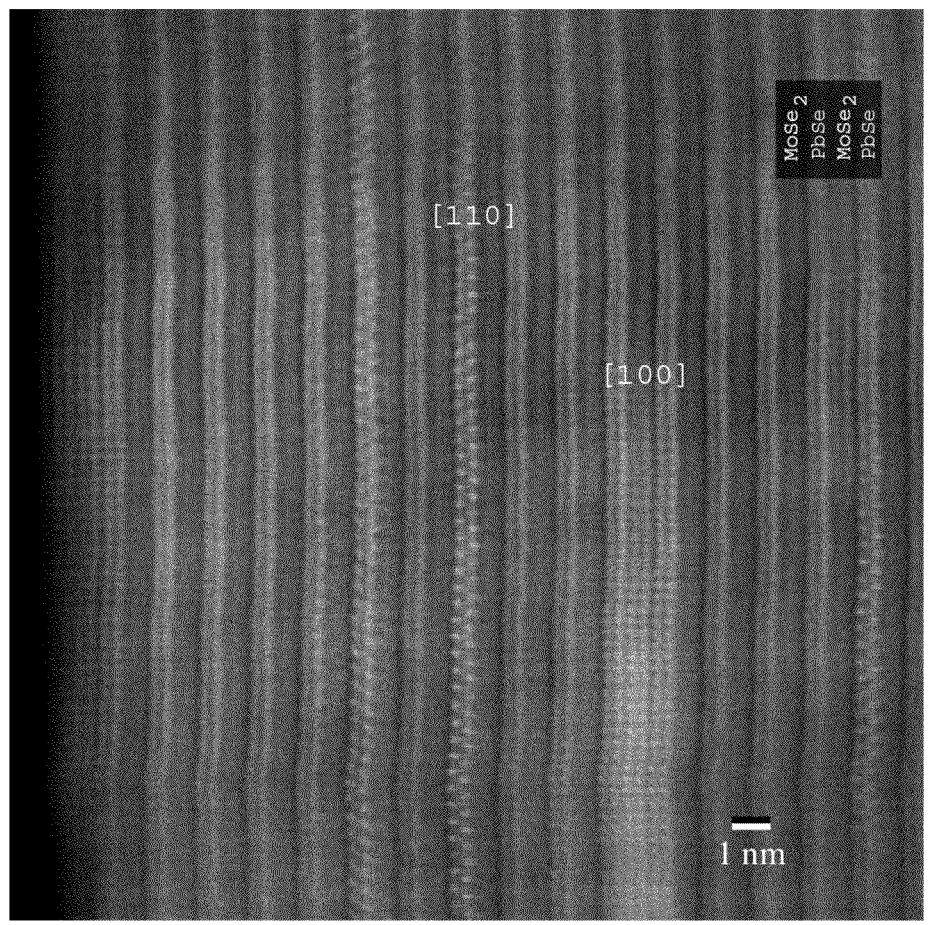

FIG. 33 is a high-magnification STEM-HAADF image from a cross-section of a [(PbSe)$_{1.00}$]$_1$[MoSe$_2$]$_1$ misfit compound. An interruption in the stacking sequence where a PbSe layer partially occupies a region where an MoSe$_2$ layer would be expected in the perfect structure is clearly apparent.

DETAILED DESCRIPTION

As used in this application and in the claims, the singular forms "a," "an," and "the" include the plural forms unless the context clearly dictates otherwise. Additionally, the term "includes" means "comprises."

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, compositions, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The compositions, apparatus. methods in the appended claims are not limited to those apparatus and methods which function in the manner described by such theories of operation.

In the following description, production of compositions and compositions of intergrowths of distorted layers having a rock salt structure with dichalcogenide layers are described having a form [MX$_{1+x}$]$_m$(TX$_2$)$_n$, wherein M is Sn, Pb, Sb, Bi, or a rare earth metal (i.e., an element with an atomic number in the range 57 to 71), X is S, Te or Se, and T is Ti, V, Cr, Nb, or Ta. The values m and n represent numbers of MX$_{1+x}$ layers and TX$_2$ planes, respectively, and the value x generally ranges from –0.05 to about 0.9, from 0.04 to about 0.8, from 0.07 to about 0.5, or from about 0.1 to about 0.6. In typical examples, the values m and n are constant throughout the composition, but in other examples the values m, n can vary throughout a composition. For example, each or some layers of a multilayered misfit compound can be differently configured based on different m, n values. In some simple illustrative examples, m=1 and n=1 or 2. In other examples, layered compositions such as $[MX_{1-x}]_m(TY_2)_n$ are produced, wherein X and Y are different and are selected from the group consisting of S, Se, and Te.

Examples of the layered compositions disclosed herein with x=0 can be represented as $(MX)_m(TX_2)_n$ that denotes m layers of MX interleaved with n layers of $TX_2$. Generally, m and n are equal or unequal positive integers. The layers based on the component MX are referred to herein as "rock salt" layers in describing some examples, and the $TX_2$ layers are referred to as dichalcogenide layers. Some examples of such layer compositions include $(PbSe)_m(NbSe_2)_n$, $(PbSe)_m(TaSe_2)_n$, and $(BiSe)_m(NbSe_2)_n$.

In such compositions, each $TX_2$ layer generally consists of a single (001)-oriented molecular layer of the transition metal dichalcogenide, with the T cations in trigonal prisms or octahedra of nested close-packed layers of X anions, with an AbA stacking sequence. Each MX layer generally contains two distorted atomic planes of the rock salt structure with (001) orientation. The rock salt layers contain equal amounts of M and X atoms and are incommensurate with the close packed X planes of the $TX_2$ chalcogen layers.

The misfit parameter x describes the difference between the density of metal cations in their respective layers. Misfit parameters reported in the literature range from y=0.07 to y=0.28. Many potential members of this class of compounds are metastable with respect to either the binary compounds, the n=m=1 compound, or other ternary compositions. The $[(PbSe)_{1.00}]_m[MoSe_2]_n$ family of misfit layer compounds is metastable with respect to a mixture of binary compounds.

Optimization of thermoelectric materials in general is challenging due to the interdependence of the several properties influencing the final efficiency. Controlling carrier density, which affects every parameter contributing to ZT, the dimensionless figure of merit, is challenging for new materials because appropriate dopants need to be found and the relationship between composition, dopant concentration and carrier concentrations must be empirically determined. For bulk materials, the carrier transport properties can typically be controlled during synthesis. In thin films, however, such control is typically difficult to attain due to the limited reproducibility in the deposition process. One solution is to apply a post deposition anneal where an excess of a bulk source of the same material is enclosed in a sealed ampoule with the thin film. The bulk source acts as a reservoir of volatile components during equilibration, so that the composition of the thin film approaches that of the bulk source.

Described herein are ranges of phase formation and electrical properties measured for representative compositions such as $[(PbSe)_{1.00}]_1[MoSe_2]_1$, the parent compound of the $[(PbSe)_{1.00}]_m[MoSe_2]_n$ family of misfit layer compounds, across a compositional range of stability and annealing methods that permit control of transport properties of $[(PbSe)_{1.00}]_1[MoSe_2]_1$.

Figure 1A:
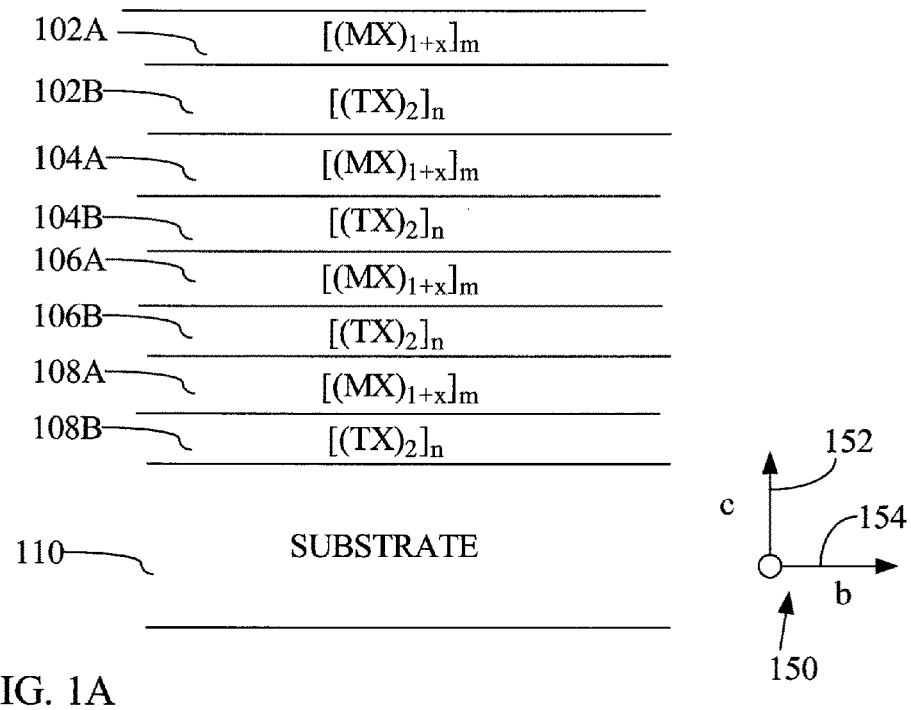
FIG. 1A is a schematic sectional view of a representative layered misfit compound.
Figure 1B:
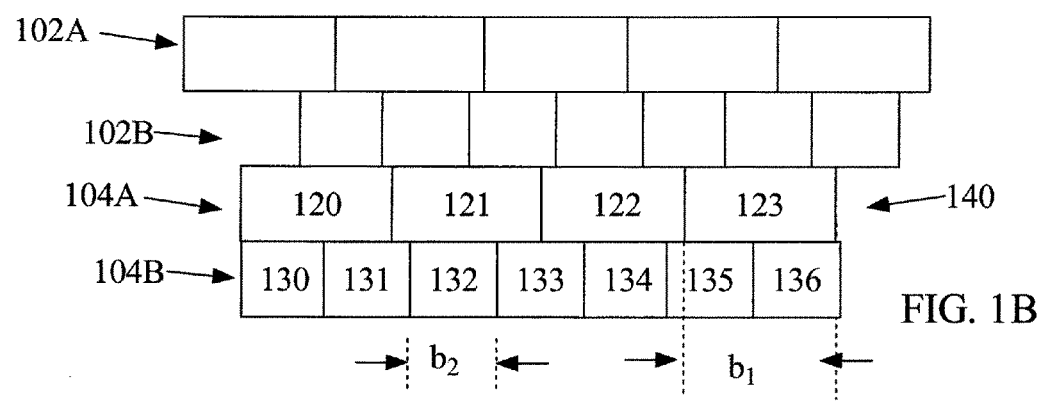
FIG. 1B is a schematic representation of an arrangement of unit cells in the layers of the layers misfit compound of FIG. 1A.

A sectional view of a representative composition is illustrated in FIGS. 1A-1B. Distorted rock salt structure layers 102A, 104A, 106A, 108A alternate with dichalcogenide layers 102B, 104B, 106B, 108B, and are situated on a substrate 110. As shown in FIG. 1A, a dichalcogenide layer 108B is next to the substrate 110, but in other examples, a distorted rock salt layer can be adjacent the substrate 110. In addition, as shown in FIG. 1A, the numbers of distorted rock salt layers and dichalcogenide layers are the same, and the layer 102A most distant from the substrate is a distorted rock salt layer, but other arrangements can be provided. The layered composition of FIG. 1A can be represented as $[(MX)_m(TX_2)_n]_i$, wherein i denotes a number of repetitions of the m+n sequence $(MX)_m(TX_2)_n$. In the example of FIG. 1A, i=4, but values between 2 and 1000, 5 and 100, or 10 and 40 are typical.

For convenience, order within layers such the representative layers 104A, 104B is illustrated in FIG. 1B as an arrangement of ordered cells throughout each layer. Typically, unit cells need not fully occupy a layer, and layer order can be characterized by a coherence length that is associated with a dimension of an ordered area. As shown in FIG. 1B, the representative layer 104A consists of a plurality of ordered cells 120-123 having a dimension $a_1$ in a direction approximately locally parallel to a layer 104A/104B interface 140. Similarly, the layer 104B consists of a plurality of ordered cells 130-136 having a dimension $a_2$ in a direction approximately parallel to the layer 104A/104B interface. Typically the ordered cells 120-123 and 130-136 are based on crystalline or other ordering of the respective layers. The layer 104A is typically distorted by the layer 104B (or other adjacent layers) and the dimensions $b_1$ and $b_2$ are generally incommensurate due to the different structures of the layers 104A, 104B. The remaining layers 102A, 102B, 106A, 106B, 108A, 108B are similarly arranged, but generally lack any defined ordering between layers. For example, each of the dichalcogenide layers 102B, 104B, 106B, 108B is randomly situated so that there is substantially no predetermined or predictable relationship between ordered cells in these different layers, or with respect to ordered cells in the layers 102A, 104A, 106A, 108A. Order or lack thereof can be quantified based on a coherence length as noted above. Coherence length within a plane (intra-planar) is generally substantially greater than a coherence length associated with different layers (inter-planar). Within a single layer such as the layer 102A, long range ordering is generally apparent, but, as noted above, subsequent layers of the same material (e.g., the layers 104A, 106A, 108A) have similar ordering within each layer, but little or no order with respect to each other.

Ordering (or lack thereof) between layers can be described further with reference to a coordinate system 150 shown in FIG. 1A. The coordinate system includes two orthogonal axes 152, 154 (referred to for convenience as a c-axis and a b-axis) and an a-axis that is orthogonal to both. The c-axis is approximately perpendicular to an interface surface between layers. For layers situated on other than flat substrates, the c-axis may be allowed to vary in direction so as to be substantially perpendicular to the layer interface throughout the layer structure as part of a local coordinate system. Each of the layers 102A-108B is substantially ordered (crystalline) in an ab-plane but in a direction parallel to the c-axis there is little or no order between layers. For example, the layers 102A, 104A do not have a fixed or predetermined relative alignment the layers are ordered with an unpredictable ab-plane offset. Surprisingly, the ordered arrangement of layers 102A, 104A, etc does not substantially propagate into any of the other layers. The layers 102B, 104B, . . . are similarly arranged. Each layer is ordered according to, for example, a characteristic crystal structure, but the structures in each layer are not predictably arranged with respect to each other. Typically, unit cell dimensions $b_1$ and $b_2$ of the layers are not integer multiples of each other.

Figure 2:
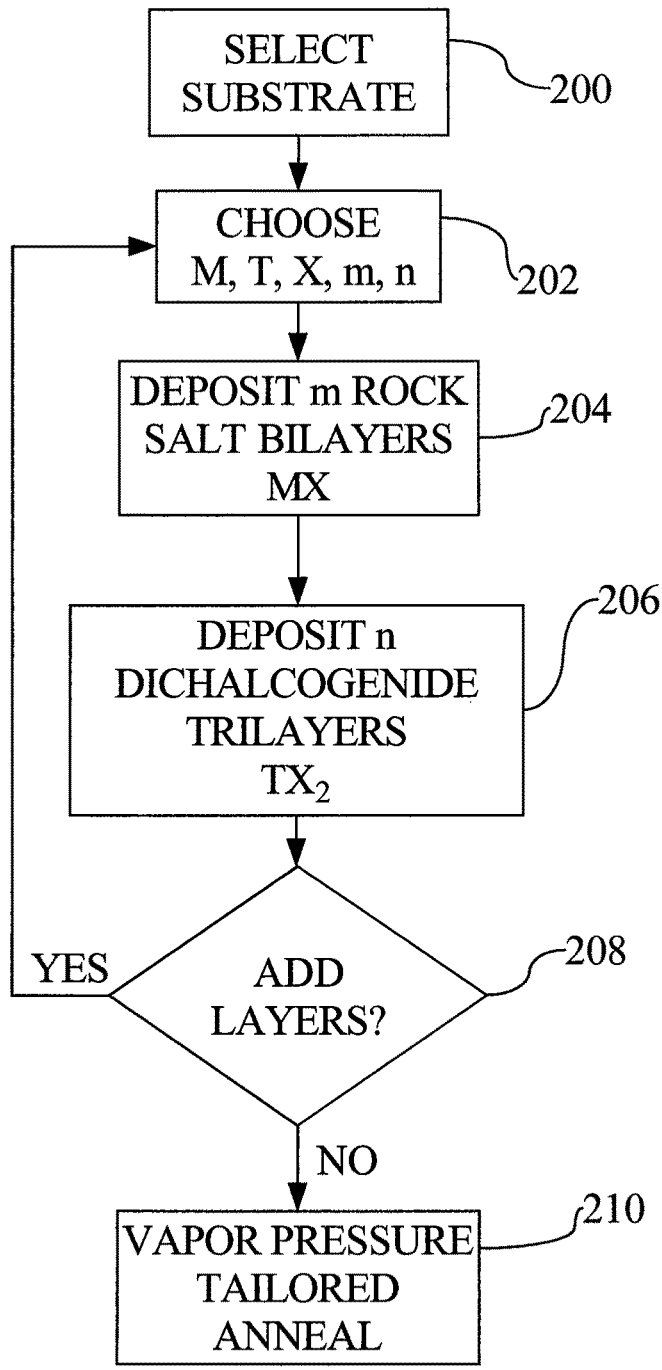
FIG. 2 is a block diagram of a method of producing layered misfit compounds.

Compositions such as illustrated in FIGS. 1A-1B can be produced by a representative method illustrated in FIG. 2. In a step 200, a substrate is selected on which sublayer, layers, bilayers, trilayers or other layered structures can be formed. Layers need not be formed directly on the substrate, and the substrate can be selected merely as a mechanical support for bilayers. In some examples, an intervening layer is provided to aid in removing a layered misfit structure from the substrate. In a step 202 a composition is selected, typically by selecting M, T, X, and a number m of rock salt bilayers and a number n of dichalcogenide trilayers. In a step 204, deposition of m bilayers containing M and X in a 1:1 atomic ratio or other suitable ratio is performed and in a step 206 n trilayers X-T-X with T:X in a 1:2 atomic ratio other suitable ratio are formed. For convenience, each of the layers in a bilayer or trilayer (i.e., layers T, X, M) is referred to herein as a sublayer and a layer is formed as a series of sublayers. In other examples, the steps 204, 206 can be reversed in order. In a step 208, it is determined if additional layers are to be formed. If so, processing returns to the step 202, and any of M, T, X, m, and n can be varied, if desired. In many examples, the same bilayer/trilayer compositions are deposited repeatedly without changing M, T, X, m, or n. If no additional layers are to be deposited, an annealing step 210 is performed under tailored vapor pressure conditions determined by providing a predetermined vapor pressure associated with one or more of the compound constituents, typically the most volatile constituent such as S or Se. In other examples, annealing is performed in a sealed container sized so as to maintain a suitable vapor pressure/for Se or S or other constituent. Processing in a controlled vapor pressure atmosphere can be particularly advantageous for applications in which layers are selected to provide desired electrical properties.

Deposition conditions are generally selected so that each of the deposited layers has a stoichiometry associated with the desired layer and the absolute thickness is selected to provide numbers of atoms suitable for forming each layer. After a selected number of layers is deposited, the layer/substrate assembly is annealed. Annealing conditions such as time and temperature can be selected based on evolution of X-ray diffraction patterns during annealing. Typically, annealing at temperatures of about 350° C. is sufficient to permit self assembly of a selected composition. Annealing temperatures of at least 550° C. can be used, and for selenium compounds, such annealing is preferably performed in sealed ampoules to prevent selenium loss.

Deposition is generally performed in a vacuum chamber at a pressure of about $10^{-7}$ T. Metals such as W, Nb, Mo, Ce, Bi, and Pb can be electron-beam evaporated at a rate of between about 0.01 nm/s and 01.0 nm/s, typically at rates of between about 0.02 nm/s and 0.04 nm/s. Se can be deposited from an effusion cell at a rate of about 0.05 nm/s, but other deposition rates or techniques can be used. A (100) silicon wafer is a convenient substrate, and total thickness of deposited layers can be in a range of between about 20-80 nm. For removal of a layered composition from the substrate, a polymethylmethacrylate coating is applied to the substrate prior to layer deposition, and then dissolved to release the layered composition. Annealing can be performed by exposing the deposited layers to a temperature of between about 350-400° C. in a nitrogen atmosphere. Additional annealing can be performed in a sealed quartz ampoule that is provided with a bulk powder of one or both components to control chalcogen vapor pressure. Alternatively, one or more additional sources can be coupled to a chamber in which annealing is carried out so as to establish a preferred vapor pressure for a particular compound.

As shown in FIG. 2, a series of layers is formed in steps 204, 206. Typically each layer of each deposited material has the same thickness, i.e., all the layers of the constituent M have the a first thickness, all layers of the constituent X have a second thickness, and all layers of the constituent T have a third thickness, wherein the first through third thicknesses can all be different. In some examples, the $TX_2$ sublayer is deposited in an X-T-X sequence, but X-X-T or T-X-X sequences can also be used. Layers are generally precisely formed so that a layer thickness is within about 0.01 nm of a target value, and typically layer thickness control to within about 0.2, 0.1, or 0.05 nm or less is sufficient to permit formation of the misfit layers. A quartz crystal oscillator can be calibrated using X-ray reflectively for thickness monitoring. Deposition geometry (source-target distance), source temperature, and excitation beam current are selected so that layer deposition rates are between about 0.01 to 0.10 nm/sec, but slower or faster rates can be used. In some examples, each elemental layer has a thickness of between about 0.01 nm and 0.1 nm, typically on the order of about 0.3 nm. Sublayer thickness in each is generally controlled to promote subsequent crystallization in the layer, and thickness errors are preferably less than about 1%, 2%, or 5%. Details of some deposition steps than can be used are described in Johnson, U.S. Pat. No. 5,198,043, which is incorporated herein by reference. For convenient illustration, preparation and properties of $[(PbSe)_{1.00}]_1[MoSe_2]$ based materials are described in detail below.

Representative Layered Composition Preparation

Thin films of $[(PbSe)_{1.00}]_1[MoSe_2]_1$ were prepared by alternately depositing elemental layers in an ultra high vacuum chamber with a background pressure during deposition of less than $10^{-4}$ Pa ($10^{-6}$ mbar). A 3 kW electron beam gun was used to evaporate elemental lead and molybdenum at a rate of ≈0.04 nm/s and ≈0.02 nm/s, respectively. An effusion cell was used to supply selenium vapor at the rate of ≈0.5 nm/s. The amount of each element deposited per layer was controlled by the length of time a shutter was kept open, and the deposition rates were monitored and controlled by a quartz crystal thickness monitor. A personal computer with suitable computer executable instructions was configured to control deposition by sequentially opening and closing the shutters and rotating the substrate between sources to produce the repeating structures of Pb—Se—Mo—Se or other materials in each of the samples. This process was repeated until the desired sample thickness was obtained.

To deposit the quantity of each element to form the respective rocksalt-structured PbSe bilayer or $MoSe_2$ trilayer, the deposition system was calibrated for each constituent individually. For lead selenide, 80 alternating layers of selenium and lead were deposited in five different films where the thickness of each selenium layer was held constant, while the thickness of the lead layers was systematically increased by increasing the time the shutter was held open. The film composition was determined using a Cameca SX50 Electron Probe MicroAnalyer operated at 10 keV, 15 keV and 20 keV, with a 20 nA beam current and 1 μm spot size. Film composition was extracted from the variation of the relative signals as a function of accelerating voltage. Pure metals and compounds were employed as microanalysis standards. Ten independent measurements at different positions on the samples were averaged to determine the final composition. Experimental values were interpolated to find the lead thickness required for a 1:1 ratio of Pb:Se. This process was then repeated for molybdenum and selenium, where the molybdenum thickness was varied while the selenium thickness was held constant, to determine the deposition parameters required to form a film with a 1:2 composition of Mo:Se. A linear relationship between the time that the shutters were kept open and the bilayer thicknesses that were determined using low angle x-ray reflectometry enabled extrapolation to shutter times where one deposition bilayer of elements was equal to one structural unit of each constituent.

The as-deposited samples were first annealed in a nitrogen drybox to form the desired structure. The oxygen partial pressures during annealing were less than 1 mL L$^{-1}$. The samples were then sealed in an evacuated quartz ampoule with a ≈1000-fold excess of either MoSe$_2$ or PbSe powder, which provides a source of Se vapor. The ampoule was annealed at different temperatures and times. After each annealing step, room temperature electrical properties of the thin film samples were measured. Sheet resistivity measurements were performed using a standard Van der Pauw method with a quartz substrate and a Greek cross pattern. The Seebeck coefficient was determined on a neighboring rectangular pattern, where a temperature gradient was induced by cooling one end of the sample via the Peltier effect. Thermocouple junctions were used to measure both the resulting temperature gradient and the induced voltage. The Seebeck coefficient was calculated from the slopes of graphs of induced voltage measured across both the copper and the constantan leads versus the measured temperature difference.

Film structure and compound formation was probed with x-ray diffraction using a Bruker D8 Discover diffractomer (Cu—K$\alpha$ radiation, of wavelength $\lambda$=0.15418 nm). A $\theta$-2$\theta$ configuration was used for high angle x-ray diffraction, scanning in the range 10°≤2$\theta$ ≤−65° with a step size of 0.05° and a counting time of 2 seconds per step. The incident beam was conditioned using 1 mm divergence and detector slits.

Cross sectioned specimens for scanning (STEM) and conventional (TEM) transmission electron microscopy analysis were prepared using the small angle cleavage technique (SACT), followed by final cleaning and thinning using a FEI NOVA NanoLab DualBeam™ FIB equipped with a Sidewinder ion column. Samples were thinned to approximately 300 nm using 30 kV accelerating voltage on the ion source, followed by a polishing step at 5 kV and final end-pointing at 2 kV. Samples were plasma cleaned using a Fischione model 1020 plasma cleaner for 5 min prior to analysis to remove any organic contamination.

The cross-sectioned specimens were characterized using STEM high-angle annular dark-field (HAADF) imaging—also known as Z-contrast imaging—in an FEI Titan 80-300™ TEM/STEM equipped with a double-hexapole, spherical aberration corrector (CEOS GmbH) operating at an accelerating voltage of 300 kV with a ≈100 pm probe containing ≈90 pA of current. To ensure proper orientation of the cross-sectioned film with respect to the electron probe, the specimen was tilted to the [011] zone axis of the single-crystal Si substrate.

Once the deposition process was calibrated, many different [(PbSe)$_{1.00}$]$_1$[MoSe$_2$]$_1$ compounds were prepared, slightly varying the deposition process to determine the range of stoichiometries in which this compound could be synthesized. To determine the range of temperatures in which [(PbSe)$_{1.00}$]$_1$[MoSe$_2$]$_1$ formed, a sample was annealed at a sequence of temperatures and x-ray diffraction patterns were collected. Initially, the film was primarily amorphous, with broad diffraction maxima indicating small crystallites nucleated during the deposition process. At temperatures below 200° C., little or no change occurred in the diffraction patterns. Between 250° C. and 500° C., there was a gradual increase in Bragg diffraction intensities, grain size and crystallographic alignment with the c-axis of the misfit layer compound perpendicular to the substrate. Above 500° C. in an open annealing system, crystallinity decreased as the samples began to decompose due to loss of selenium. Using these data as a guide, deposited samples were annealed and twenty-one of them clearly formed [(PbSe)$_{1.00}$]$_1$[MoSe$_2$]$_1$. The observed compositions all cluster around that calculated for [(PbSe)$_{1.00}$]$_1$[MoSe$_2$]$_1$, using the measured in-plane lattice constant of each component to calculate the density of atoms in the a-b plane of each constituent. FIG. 27 shows diffraction patterns for five of these films, exhibiting the range of peak widths and intensities obtained from the twenty-one samples. The lattice parameters ranged from 1.241 nm to 1.275 nm, as summarized in Table 1 below, which also includes the compositions, resistivities and Seebeck coefficients for the compounds after annealing at 400° C. in an oxygen-free dry-box.

TABLE 1

The c-axis lattice parameters of 21 [(PbSe)$_{1.00}$]$_1$[MoSe$_2$]$_1$ samples, along with selected measured compositions, resistivity and Seebeck coefficients.

| Sample | c-lattice parameter (nm) | error | Resistivity ($\Omega$m) | Seebeck Coefficient ($\mu$V/K) | Pb Content (at. %) | Mo Content (at. %) | Se Content (at. %) |
|---|---|---|---|---|---|---|---|
| 44a | 1.259 | 0.03 | | | 17 | 18 | 64 |
| 112d | 1.258 | 0.05 | | | 21 | 19 | 61 |
| 112f | 1.260 | 0.04 | | | | | |
| 116x | 1.2700 | 0.003 | 0.2000 | −181 | 20 | 20 | 60 |
| 126a | 1.269 | 0.02 | | | 20 | 20 | 60 |
| 127a | 1.269 | 0.01 | | | 21 | 19 | 60 |
| 128a | 1.268 | 0.02 | | | 20 | 20 | 59 |
| 139x | 1.275 | 0.03 | 0.2020 | 91 | | | |
| 173x | 1.2730 | 0.004 | 0.0323 | | 22 | 24 | 54 |
| 173y | 1.275 | 0.05 | 0.1830 | | | | |
| 174x | 1.273 | 0.007 | 0.2039 | | 18 | 20 | 62 |
| 174y | 1.274 | 0.04 | 0.0658 | | | | |
| 175x | 1.274 | 0.05 | 0.0642 | | | | |
| 175y | 1.2731 | 0.009 | 0.2026 | | | | |
| 176x | 1.274 | 0.06 | 0.0574 | | | | |
| 176y | 1.2727 | 0.009 | 0.0563 | | | | |
| R-1 | 1.266 | 0.01 | 0.00007 | −5 | | | |
| R 0 | 1.245 | 0.01 | 0.00005 | −5 | | | |
| R 1 | 1.247 | 0.01 | 0.00008 | −5 | | | |
| R 2 | 1.241 | 0.01 | 0.00009 | −5 | | | |
| R 3 | 1.246 | 0.01 | 0.65 | 35 | | | |

As can be seen from the data in Table 1 and the representative diffraction patterns, the single-phase field of the compound has a macroscopic range of homogeneity, with a corresponding range in lattice parameter, varying intensities between different 00l Bragg diffraction peaks, and a significant spread in electrical properties from sample to sample. The resistivity values ranged over nearly five orders of magnitude, from 0.307 Ω-m to 70 Ω-m, and Seebeck coefficients ranged from −181 μV/K to 91 μV/K after the initial annealing to form the basic structure.

In an attempt to refine the electrical properties, the annealing temperature of several samples was varied, as shown in FIGS. 28-29. Two different behaviors were observed. In four of the samples, the resistivity remained in the $10^{-5}$ Ω-m range and the Seebeck coefficients were small, as expected for a metallic system. In a fifth sample, the resistance dropped to $1.5 \times 10^{-2}$ Ω-m and the Seebeck coefficient changed sign, from +35 μV/K to −82 μV/K, as the sample was annealed at higher temperature.

Samples were placed in a quartz ampoule under vacuum with a large excess of a bulk source of one of the components, effectively buffering the chemical activity. The samples were annealed with the goal of establishing equilibrium between the vapor pressure of the sample and that of the source. To determine the time required to reach equilibrium, three samples were annealed at 400° C. for increasing amounts of time in the presence of lead selenide powder. FIG. 30 shows the change in resistivity for these samples as a function of time. Equilibrium appears to be reached within eight hours. The data indicate that equilibrium is not diffusion-limited at this annealing temperature, as sample thickness did not affect the rate of change of the properties, but that mass transfer through the vapor phase is the rate-limiting step. The difference in the final resistivities is a consequence of a corresponding difference in carrier concentrations, carrier mobilities, or a combination thereof.

To determine the effect of chemical activity on the electrical properties, samples were annealed first with PbSe, then with $MoSe_2$, and finally again with PbSe. Each time the samples were annealed for 12 h at 400° C., long enough to reach equilibrium. Transport properties were measured following each annealing step. FIG. 31 shows the change in carrier properties resulting from the annealing sequence. After annealing the first time with a PbSe buffer, a slight increase in resistivity is observed and the Seebeck coefficient reverses its sign, changing from 100 $\mu VK^{-1}$ to −80 $\mu VK^{-1}$, indicating that the majority carriers have changed from holes to electrons. Subsequent annealing with a $MoSe_2$ buffer results in a significant drop in resistivity and a continued decrease in the Seebeck coefficient, which reaches a value of −180 $\mu VK^{-1}$. The drop in resistivity concurrent with the change in the Seebeck coefficient suggests an increase in mobility for the majority carriers. Annealing again in the PbSe buffer leads to an increase in resistivity, but it does not return it to the value observed following the first annealing, and the Seebeck coefficient increases to −100 $\mu VK^{-1}$. The difference in both conductivity and Seebeck coefficient between these two anneals in PbSe is consistent with an increase in mobility with annealing.

While the electrical properties appear to trend similarly during annealing cycles, the continued disparity in the properties indicates the possible presence of structural defects that are not affected by the annealing process. To examine the local, atomic-scale structure of the films, STEM-HAADF images were acquired in an aberration-corrected electron microscope. As shown in FIG. 32, cross sectional STEM images are consistent with the x-ray diffraction evidence of a well-ordered structure along the c axis, as the individual ≈0.6 nm-thick structural units of the PbSe and $MoSe_2$ are clearly visible and oriented parallel to one another. In-plane rotational disorder is also apparent, as only on occasion are layers oriented at a low-index zone-axis with respect to the incident beam, and different zone-axis orientations are observed within the field of view. The projected grain size, indicated by the spatial extent in the a-b plane of the individual orientations within a particular layer, is on the order of ten to a hundred nanometers.

While FIG. 32 is consistent with a well-ordered misfit layer compound in the c-direction, the STEM-HAADF images also indicate interesting local defects. In FIG. 33, regions are apparent where the rock salt structured layer appears to grow through the $MoSe_2$ layer. However, because the two components are of comparable size, the long range stacking is not disturbed. This type of defect may result a broadening of the 00l diffraction peaks, as the coherence length of the structure is reduced by the difference in the thickness of the constituent layers.

XRD data show that the misfit compound with the ideal formula $[(PbSe)_{1.00}]_1[MoSe_2]_1$ forms over a range of composition, leading to a spread of lattice parameters and to differences in the quality of the 00l diffraction patterns. Electrical properties vary considerably, presumably due to differences in defect concentrations caused by the spread in composition. Annealing in an open system results in two distinct electrical behaviors, one with a high conductivity and a low Seebeck coefficient, as expected for a heavily doped semiconductor or metal, and another with a lower conductivity and a higher Seebeck coefficient, as expected for a semiconductor. Annealing under a controlled atmosphere of selenium produced samples with low conductivities and large negative Seebeck coefficients, suggesting an n-doped semiconductor. The spread of composition, lattice parameters and electrical properties suggest the presence of volume defects in the films. STEM-HAADF images confirm the layered structure with alternating layers of PbSe and $MoSe_2$ in $[(PbSe)_{1.00}]_1[MoSe_2]_1$, consistent with the XRD studies. STEM images also show occasional interruption in the stacking sequence, where PbSe partially occupies a region where $MoSe_2$ would be expected in the perfect structure.

Additional Representative Layered Compositions and Properties

Based on the methods described above, a variety of layered compositions have been produced. In one example, layers were selected to form the misfit compound $[(BiSe)_{1.00}]_m(NbSe_2)_n$, and exposed to varying annealing conditions. After source calibration, the layered composition with m=n=1 was formed, followed by subsequent syntheses for differing values of n, m. After calibrations of additional sources, the layered compositions $[(CeSe)_{1.14}]_m(NbSe_2)_n$, $[(PbSe)_{1.10}]_m(NbSe_2)_n$, $[(BiSe)_{1.12}]_m(TaSe_2)_n$ were formed as representative of the families $[(CeSe)_{1+x}]_m(NbSe_2)_n$, $[(PbSe)_{1+x}]_m(NbSe_2)_n$, $[(BiSe)_{1+x}]_m(TaSe_2)_n$.

Figure 3:
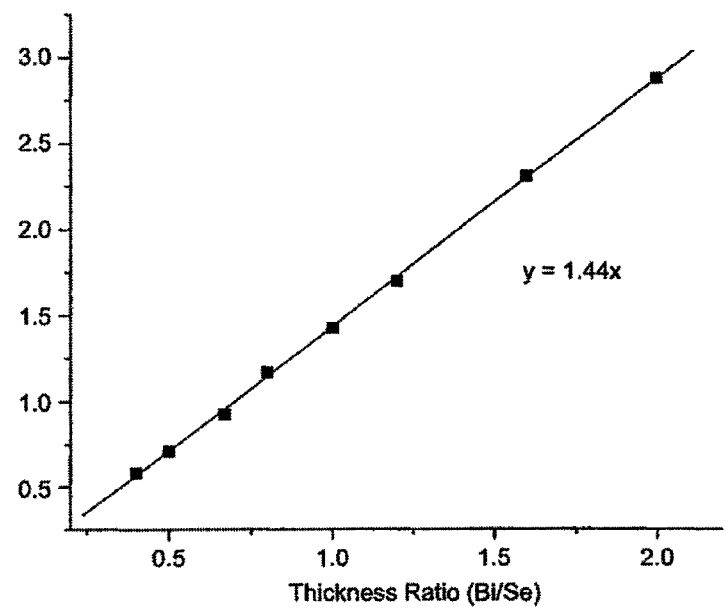
FIG. 3 is a plot of atomic ratio (Bi:Se) as a function of Bi:Se thickness ratio obtained using a quartz crystal microbalance based on time and deposition rate. A thickness ratio of 1:1.143 Bi:Se produces a desired 1:1 atomic ratio.

Source calibration typically is based on determining a duration during which a shutter is to be held open to deposit a specified amount of a particular element so as to form single layers of compounds such as MSe or $TSe_2$. A ratio of deposition time and resulting film composition was determined for each pair of elements separately. Alternating layers of a metal and a chalcogen were repeatedly deposited, creating a series of samples of different compositions by holding the Se deposition time constant while increasing metal deposition time. Electron probe microanalysis was used to determine the metal:Se atomic ratio. FIG. 3 is a plot of atomic ratio (Bi:Se) as a function of Bi:Se thickness ratio obtained using a quartz crystal microbalance. XRR was used to measure actual thickness of each M/Se bilayer deposited so that depositions could be configured to produce approximately one unit cell of material.

Figure 4:
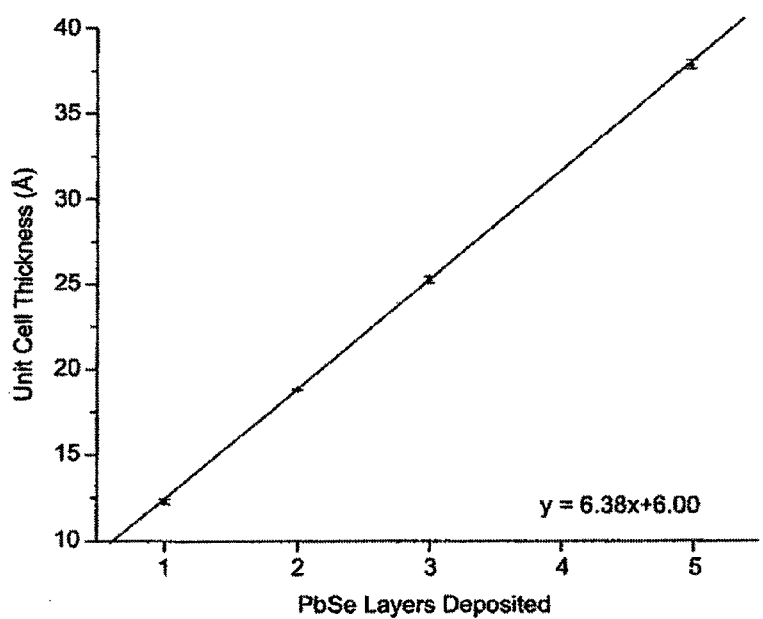
FIG. 4 is a graph of measured thickness as a function of number m of PbSe layers in a $PbSe/NbSe_2$ composition. The slope of the measured thickness corresponds to the thickness of the PbSe components, and the intercept to the thickness of the $NbSe_2$ components.

Several series of films were deposited, varying n with constant m and then varying m with constant n to achieve a selected amount of each constituent for the desired Se-M-Se and rock salt layers. In a representative example, a sequence of four $(PbSe)_m(NbSe_2)_n$ films were deposited, with m=1, . . . , 5 and n=1. FIG. 4 is a graph of measured thickness as a function of number m of PbSe layers in a PbSe/NbSe$_2$ composition. The slope of the measured thickness corresponds to the thickness of the PbSe components, and the intercept to the thickness of the NbSe$_2$ components. As shown in FIG. 4, the PbSe bilayer was thicker than desired (0.640 nm instead of 0.617 nm) while the NbSe$_2$ layer was 0.600 nm instead of the calculated target value of 0.632 nm. This procedure was repeated until the deposition parameters produced film thicknesses within 2% of the targeted thicknesses.

Electron probe microanalysis was used to determine cation ratios. Typically, a slight excess chalcogen content is preferred to promote crystal growth. An estimated misfit between the constituents is obtained from the lattice parameters of the binary components. For $[(PbSe)_{1+x}]_m(NbSe_2)_n$, x=0.07.

Figure 5:
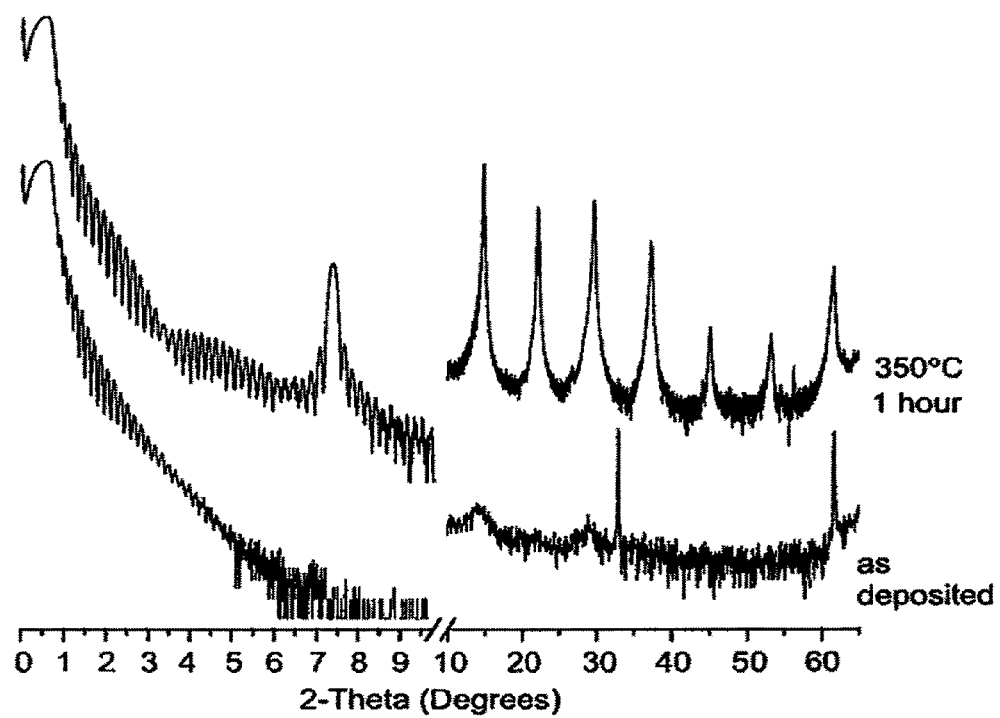
FIG. 5 contains low angle and high angle diffraction patterns for an as deposited n=m=1 compound $[(BiSe)_{1.10}]_1(NbSe_2)_1$ and the compound after annealing at 350° C. for 1 hour.

Low angle and high angle diffraction patterns are shown in FIG. 5 for an as deposited n=m=1 compound $[(BiSe)_{1.10}]_1(NbSe_2)_1$ and the compound after annealing at 350° C. for 1 hour. Even prior to annealing, weak broad diffraction peaks indicate that small crystallites of the compound have begun to form. After annealing, the diffraction pattern contains the expected 00l diffraction maxima.

Figure 7:
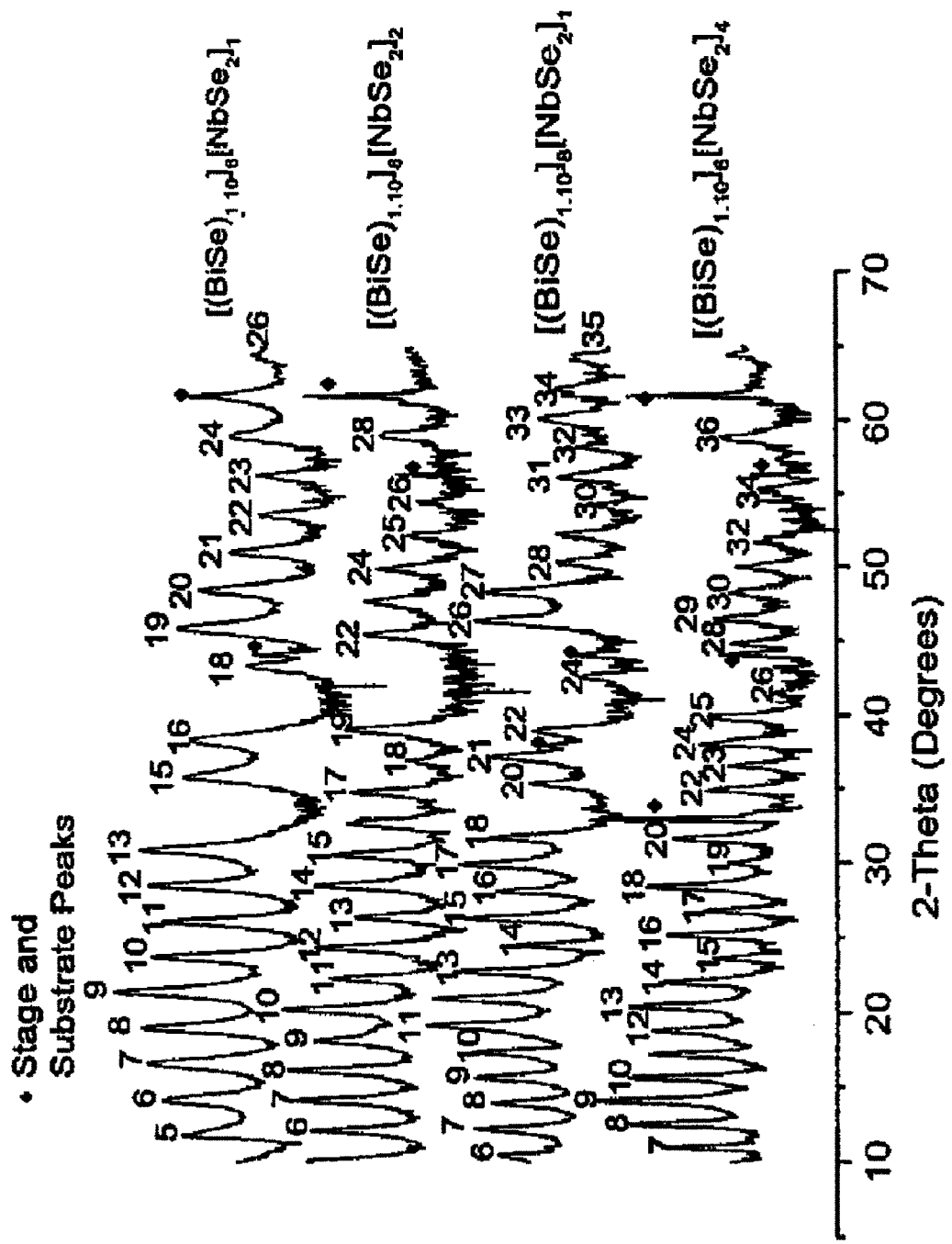
FIG. 7 contains diffraction data for several members of the $[(BiSe)_{1.10}]_m(NbSe_2)_n$ family.
Figure 9:
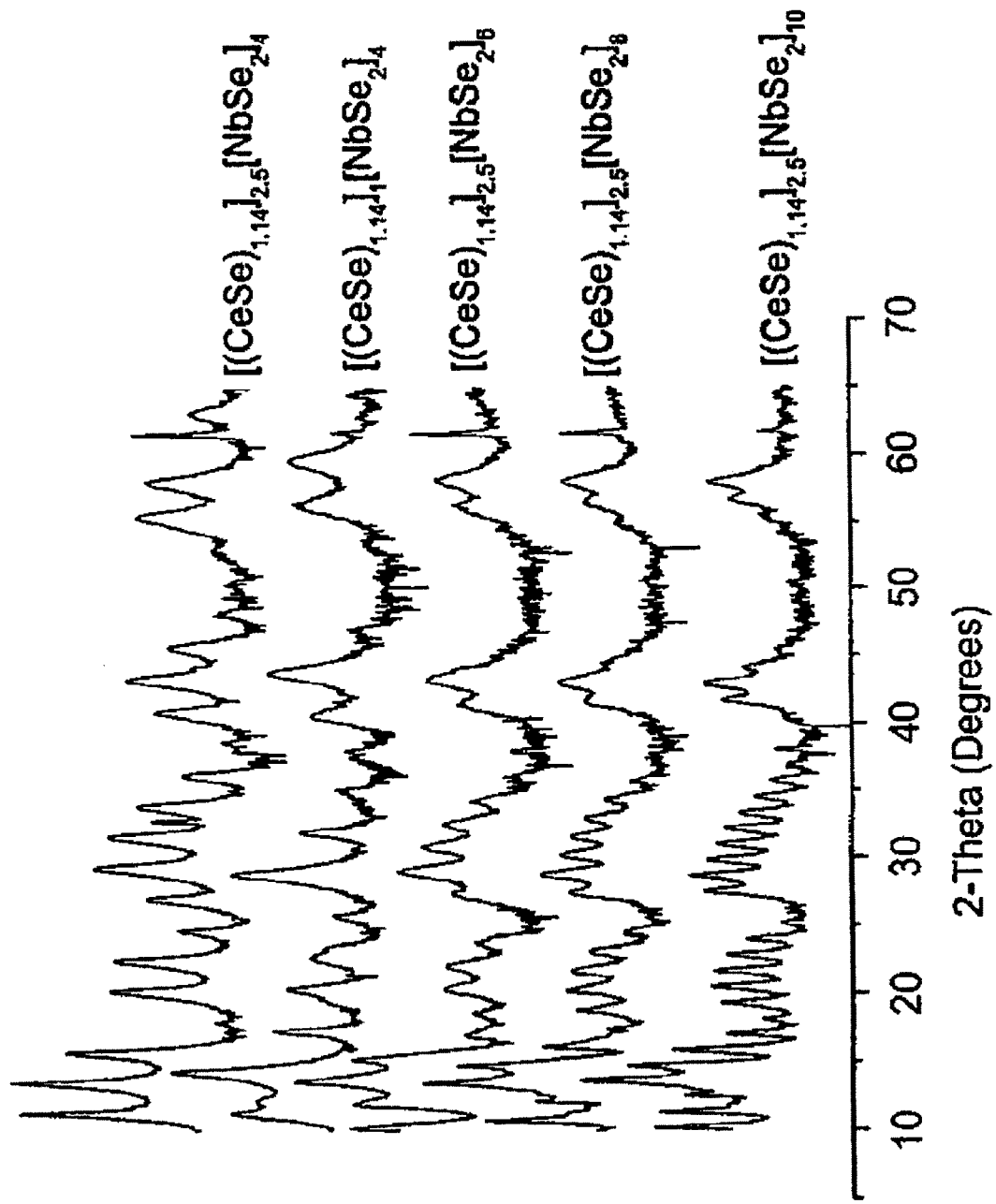
FIG. 9 contains diffraction patterns for some members of the $[(CeSe)_{1.1+x}]_m(NbSe_2)_n$ family.
Figure 10:
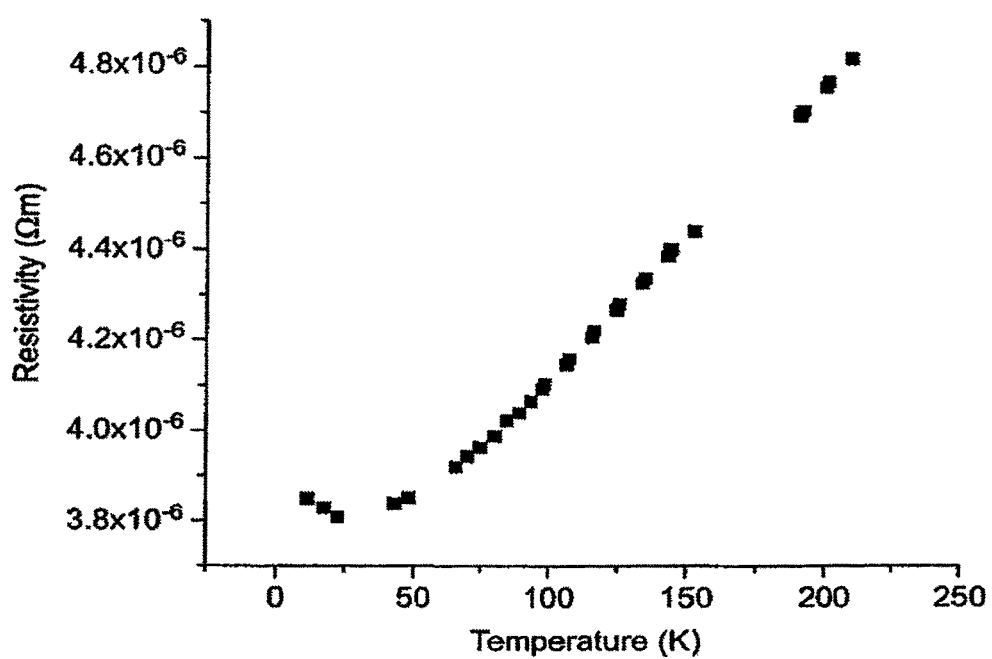
FIG. 10 is a graph of resistivity as a function of temperature for $[(PbSe)_{1.10}]_1(NbSe_2)_1$.

FIG. 6 is a table of unit cell thickness for additional members of the $[(BiSe)_{1.10}]_m(NbSe_2)_n$ family and FIG. 7 contains diffraction data for several members of this family. While every family member should be synthesizable, some examples (for example, some m=2 compounds) are made only as mixed phase films. FIG. 8 is a table of unit cell thickness for additional misfit layered compounds that have been made in a similar manner. FIG. 9 contains diffraction patterns for some members of the $[(CeSe)_{1.14}]_m(NbSe_2)_n$ family. Misfit layer compounds are generally anisotropically metallic. Initial measurements on selected $[(PbSe)_{1+x}]_m(NbSe_2)_n$ family members show metallic behavior in an ab-plane. FIG. 10 is a graph of ab-plane resistivity as a function of temperature for a $[(PbSe)_{1.10}]_1(NbSe_2)_1$ layered structure. A 50 nm film of this material has a resistivity of 6.8 $\mu\Omega$-cm which is slightly higher that the value for bulk material. In this family, room temperature resistivity was relatively independent of the number of NbSe$_2$ layers, but increased significantly with increases in PbSe thickness. Measured in-plane resistivities and room temperature Seebeck coefficients are tabulated in FIG. 11.

Figure 12A:
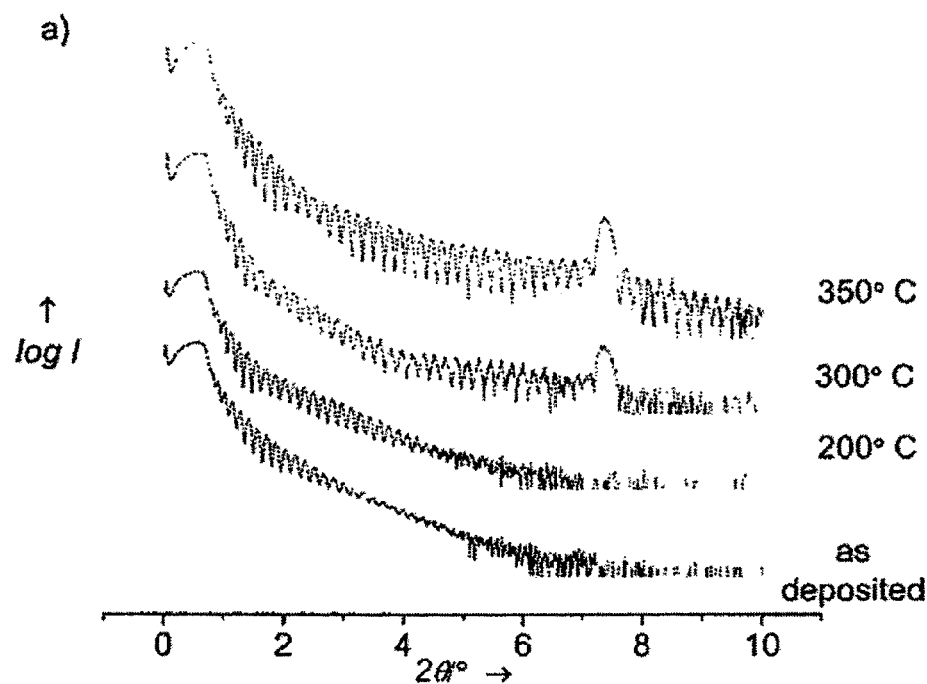
FIG. 12A is a graph of reflected X-ray diffraction intensity (I) as a function of angles up to 10 degrees for a $[(BiSe)_{1.10}]_1(NbSe_2)$ layered compound as a function of annealing temperature.
Figure 12B:
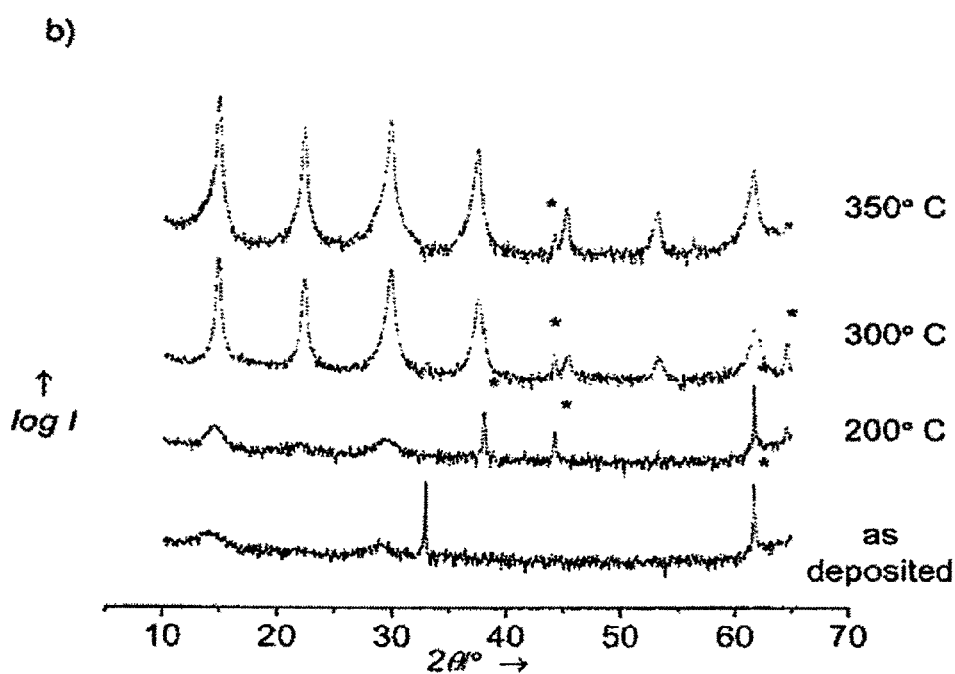

FIG. 12A contain a graphs of low angle X-ray reflection intensity as a function of annealing temperature for an unannealed $[(BiSe)_{1.10}]_1(NbSe_2)$ specimen and specimens annealed at different temperatures (200, 300, 350° C.) for a period of about 2 hours. As shown in FIG. 12B, higher angle diffraction data indicates superlattice growth as a function of annealing temperature and time showing 00l diffraction lines emerging at higher temperatures.

FIG. 13 shows reflected X-ray diffraction intensity data for four $[(PbSe)_{0.99}]_m(WSe_2)_n$ layered compounds (m=1, 2 and n=1, 2) after annealing for 400° C. for one hour. The misfit value x was calculated from the in-plane unit cells dimensions of the components. Twenty five compounds in this family with m, n ranging from 1 to 5 have been prepared.

FIG. 14 illustrates changes in lattice parameters as a function of n or m for five systems that have been prepared. For each of these systems, regular changes in lattice parameter are observed as a function of m and n. For example, for the $[PbSe_{0.99}]_m(WSe_2)_n$ family, a unit change in n is associated with an increase in lattice parameter of about 0.614 nm.

As noted above, specimen ordering can become more apparent as a function of annealing temperature and time. Typically, annealed specimens exhibit 00l diffraction orders for diffraction angles of at least $2\theta=74°$ that are associated with interwoven planes. In an ab-plane, the usual hk0 diffraction maxima appear. For example, for $[PbSe_{1.00}]_m(MoSe_2)_n$, a-lattice parameters are measured as 0.6163±0.0003 nm and 0.3310±0.0009 nm for PbSe and MoSe$_2$, respectively. Corresponding values for bulk compounds are 0.6121 nm and 0.3289 nm, respectively. In this example, an in-plane coherence length for the rock salt layers is about 13 nm while for the dichalcogenide layers, the coherence length is about 6 nm. Film coherence length between layers can be controlled based rock salt layer thickness and annealing time and temperature.

FIGS. 15A-15B illustrate electrical performance enhancements to layered structures that are provided by suitable annealing processes. As shown in FIG. 15A, three specimens are annealed at 400 C in (1) a nitrogen atmosphere for 1 hr., (2) a sealed environment with an Se overpressure for 1 hr., and (3) in a sealed Se environment for 2 hr. Annealing in a sealed Se environment for 2 hours produces substantially the same electrical resistivity for all three samples, while annealing in an Se overpressure for 1 hour produces substantially the same Seebeck coefficient for all three samples.

Representative compositions $[(PbSe)_m(MoSe_2)_n]_i$ with m=1 to 5, n=1 to 5, and i=10 to 40 were formed using a 1 hour anneal at 400° C. in a dry nitrogen environment. Total thicknesses of the annealed films were between about 40 nm and 60 nm except for a sample having a composition $[(PbSe)_3(MoSe_2)_3]_i$ which had a thickness of about 115 nm. Additional representative compositions $[(PbSe)_m(WSe_2)_n]_i$ were synthesized and had thicknesses between about 20 nm and 60 nm. For comparison, single-component MoSe$_2$ and PbSe films were formed in the same manner, and had thicknesses, after annealing, of between about 80 nm and 120 nm, respectively.

Other representative compounds that can be produced in this or a similar manner include the two component composition $[(Bi_2Te_3)_3(Sb_2Te_3)_3)]_i$, and as well as single-component films such as Bi$_2$Te$_3$ and Sb$_2$Te$_3$. In one example, the constituent bilayers were annealed differently by loading samples into quartz ampoules with a Te-rich Bi$_2$Te$_3$ powder and evacuated to $10^{-6}$ Torr. The two component films were annealed at 150° C. for 110 min., at 250° C. for 50 min., or at 300° C. for 55 min. After annealing, the two component films were about 60 nm thick. Bi$_2$Te$_3$ films were annealed in a dry nitrogen atmosphere at 100, 150, 200, 250, 300, or 350° C. for 15 min., or at 400° C. for 1 min. Sb$_2$Te$_3$ films were annealed in a dry nitrogen atmosphere at 100, 150, 200, 250, or 300° C., or 350° C. for 2 min., or at 400° C. for 1 min. The single-component films were about 100 nm thick.

The composition and structure of these films were measured. Stoichiometry and oxygen contamination were measured using electron probe microanalysis. Oxygen content was about 5 at. % in the misfit layer films, 7 at. % in the three component films, and 3 at. % in the two component films. Crystalline quality, orientation, and film thickness were evaluated using x-ray diffraction and x-ray reflectivity (XRR). Film thickness was measured from Kiessig fringes in low angle x-ray reflectivity (XRR) scans. Repeat unit period was measured form the position of the satellite peaks of the high angle (00l) diffraction peaks.

Cross-plane thermal conductivity for $(PbSe)_m(WSe_2)_n$ films plotted as a function of PbSe content and as a function of thickness of the multilayer period is shown in FIG. 16 and FIG. 17, respectively. As in other examples, m is a number of PbSe bilayers and n is a number of $WSe_2$ sheets.

Cross-plane thermal conductivity for films based on $(Bi_2Te_3)$ and $(Sb_2Te_3)$ is graphed in FIG. 18 as a function of annealing temperature. Data for two component multilayers $(Bi_2Te_3)/(Sb_2Te_3)$ is shown with open triangles, three-component multilayers $(Bi_2Te_3/TiTe_2/Sb_2Te_3)$ is shown with filled triangles, single component $Sb_2Te_3$ is shown with open circles, and single component $Bi_2Te_3$ is shown with closed circles. The single data point for the three component multilayer is based on an average of several structures.

FIG. 19 contains a graph of cross-plane thermal conductivity as a function of superlattice period for three-component multilayers $Bi_2Te_3/TiTe_2/Sb_2Te_3$ (filled triangles) and two-component multilayers $Bi_2Te_3/Sb_2Te_3$ (open triangles) for samples annealed at 250° C. A calculated minimum thermal conductivity is shown as a dashed line for comparison. Data for $Bi_2Te_3/Sb_2Te_3$ superlattices is taken from Touzelbaev et al., J. Appl. Phys. 90:763 (2001). FIG. 20 is a graph of longitudinal speed of sound for three component $Bi_2Te_3/TiTe_2/Sb_2Te_3$ films.

Longitudinal speed of sound for $(PbSe)_m(MoSe_2)_n$ films and $(PbSe)_m(WSe_2)_n$ films as a function of PbSe fraction $2m/(2m+3n)$ are plotted in FIG. 21 and FIG. 22, respectively. Cross-plane thermal conductivity for $(PbSe)_m(MoSe_2)_n$ films is plotted as a function of PbSe content (FIG. 23) and as a function of thickness of the multilayer period (FIG. 24).

Other representative compounds include $[(PbSe)_{1.00}]_2(NbSe_2)$, $[(PbSe)_{1.00}]_2(MoSe_2)$, and families such as $[(PbSe)_{0.99}]_m(WSe_2)_n$. In some convenient examples, m and n range from 1 to 2, but each can range up to at least about 10 or higher.

Three component films have been synthesized having layer formulas $[(TiTe_2)_3(Bi_2Te_3)_x(TiTe_2)_3(Sb_2Te_3)_y]_i$, wherein x=1-5, y=1-5, and i=5-7. A typical synthesis involves depositing sequences of bilayers onto unheated (001) silicon wafers. For example, three bilayers of Ti and Te in a 1:2 atomic ratio are deposited, followed by x bilayers of Bi and Te in a 2:3 atomic ratio, three bilayers of Ti and Te as before, followed by y bilayers of Sb and Te in a 2:3 atomic ratio. This deposition sequence is repeated i times and the resulting layers are annealed for 5 min. at 250° C. in dry nitrogen. After annealing, thicknesses were about 55 nm.

The above examples are representative only, and other layered misfit compounds and other layered compositions can be produced using the disclosed methods. The layered compounds described herein generally comprising alternating layers of rock salt structures and dichalcogenides or other alternating layers. Upon annealing, each of the layers is generally ordered within the layer but the layers lack layer-to-layer order. Such layered compounds offer advantageous electrical and thermal properties for various applications, including as thermoelectric devices.

For convenience, layered structures that include the same numbers of layers of each constituent can be referred to as isomers. For example, representative isomers 2501-2506 of a 12 layer structure that includes 6 layers each of a first constituent 2510 and a second constituent 2512 are shown in FIG. 25. In one example, the isomers of FIG. 25 are based on a compound that includes six layers of $MoSe_2$ and PbSe. FIG. 26 is an electron microscopic image of a section of one example isomer, $(MoSe_2)_5(PbSe)_1(MoSe_2)_1(PbSe)_5$.

In typical examples, nanostructured solids as described herein based on multiple nanolayers can provide controlled carrier concentrations down to $10^{17}$ cm$^{-3}$ and mobility values greater than 100 cm$^2$V$^{-1}$s$^{-1}$. Kinetically stable graded structures are provided and representative layers arrangements include multiple isomers of the same stoichiometry with different nanostructures, Fibonacci superlattices, and other periodic or aperiodic structures.

Nanostructure Based Control of Thermal Conductivity.

Nanostructures formed in the disclosed misfit layer compounds or other materials can also be used to control (typically to lower) thermal conductivity. Nanoparticles can be imbedded to provide a preferred nanoparticle separation, nanoparticle size, matrix/nanoparticle mass density difference, or aspect ratio of nanoparticles. Layer thickness and/or composition can be graded to tune electrical or thermal properties independently, or to tune a ratio of electrical conductivity to thermal conductivity. Formation of transition metal dichalcogenide nanoplatelets in layered compositions can permit such tuning in, for example, conductivity and electrical properties of a PbSe and/or PbTe matrix. Such nanonplatelets can be formed in a sequence of samples in which, for example, single 6 Å thin transition metal diselenide layers (Se—T—Se trilayers) are situated between PbSe layers. PbSe layer thickness can be varied to produce $(PbSe)_n(MoSe_2)_1$. Alternatively, a similar total material thickness can be selected by with an increasing thickness of a Pb/Se bilayer and decreasing thickness of the W/Se bilayer so that PbSe replaces a region of the $WSe_2$ layer. In this way, a series of layers of composition of $(PbSe)_n[(MoSe_2)_{1-\delta}(PbSe)_\delta]_1$ can be prepared with variable n and $\delta$.

The Z-STEM image of $(PbSe)_1(MoSe_2)_1$ in FIG. 26 shows such a replacement in the lower middle of the image. At the top of the figure one observes the expected $(PbSe)_1(MoSe_2)_1$ structure with the layers alternating as one moves across the image, whereas at the bottom one observes alternating layers except for a region with six consecutive [100] planes of PbSe. A sequence of $(PbSe)_1[(MoSe_2)_{1-\delta}(PbSe)_\delta]_1$ samples have been prepared, where the maximum $\delta$ varied from 0 to 0.2 resulting in samples with the same well defined superlattice period but containing partial layers of $MoSe_2$. Since the thicknesses of the Se—Mo—Se trilayer is very close to the thickness of two [100] planes of PbSe, this structural defect readily forms and does not significantly distort the neighboring planes. X-ray diffraction patterns of these $(PbSe)_1[(MoSe_2)_{1-\delta}(PbSe)_\delta]_1$ samples are of similar quality to that of $(PbSe)_{1-\delta}(MoSe_2)_1$. Other compositions such as $(PbSe)_n[(MoSe_2)_{1-\delta}(PbSe)_\delta]_1$ wherein n=5 and 10 can be prepared. Nanoparticle concentration can be determined by selection of $\delta$ and separation can be determined by n in order to reduce or minimize thermal conductivity of $((PbSe)_n[(MoSe_2)_{1-\delta}(PbSe)_\delta]_1)$. Nb can be substituted for Mo to obtain solid solutions of $(PbSe)_n[(Mo_{1-x}Nb_xSe_2)_{1-\delta}(PbSe)_\delta]_1$. This permits nanoparticle concentration and internal doping level of the nanoparticles to be independently tuned in order to select electrical and thermal transport properties. For $\delta$ greater than about ⅓, the transition metal dichalcogenide component is not expected to be a continuous layer through the sample in any direction, and an asymmetry of the mobility and the Seebeck coefficient can be due to the platelet shape of the dichalcogenide component. In a direction parallel layer interfaces, conductivity to generally dominated by the matrix while in the perpendicular direction, Seebeck coefficients are enhanced. An in-plane conductivity measurement on $(PbSe)_1(NbSe_2)_1$ gave electrical conductivities that are several orders of magnitude greater than $(PbSe)_1(MoSe_2)_1$.

It should be recognized that the illustrated embodiments are only selected examples and should not be taken as limiting the scope of the disclosure. The scope of the invention is defined by the following claims and we claim as our invention all that comes within the scope and spirit of these claims.

We claim:

1. A composition, comprising:
an alternating plurality of ordered layers of a first composition MX and a second composition $TX_2$, wherein M is one of Sn, Pb, Sb, Bi, or a rare earth metal, X is S or Se and T is Ti, V, Cr, Nb, or Ta, wherein m layers of the first composition alternate with n layers of the second composition, wherein m and n are positive integers and m, n>2, and wherein the ordered layers of the first and second compositions are misfit with respect to each other and the ordered layers of the first composition are disordered with respect to each other and the ordered layers of the second compositions are disordered with respect to each other.

2. The composition of claim 1, further comprising a substrate, wherein the alternating plurality of ordered layers conforms to the substrate.

3. The composition of claim 1, wherein each of the ordered layers of the first composition has a common thickness.

4. The composition of claim 1, wherein each of the ordered layers of the first composition has a common composition.

5. The composition of claim 1, wherein each of the ordered layers of the second composition has a common thickness.

6. The composition of claim 1, wherein each of the ordered layers of the second composition has a common composition.

7. The composition of claim 1, further comprising at least one ordered layer having a third composition different than the first and the second compositions and situated adjacent a layer having the first composition or the second composition, wherein the third composition is one of M'X or T'$X_2$, wherein M' is Sn, Pb, Sb, Bi, or a rare earth metal, and T' is Ti, V, Cr, Nb, or Ta.

8. The composition of claim 1, further comprising a silicon substrate configured to support the alternating plurality of layers.

9. The composition of claim 8, wherein a layer of the first composition is situated on a (001) surface of the silicon substrate.

10. The composition of claim 9, wherein a layer of the second composition is situated on a (001) surface of the silicon substrate.

11. The composition of claim 1, wherein m and n are positive integers >3.

12. The composition of claim 11, wherein m and n are less than 10.

13. The composition of claim 1, wherein each of the layers has a thickness between about 1 nm and about 200 nm.

14. The composition of claim 1, wherein each of the layers has a thickness between about 20 nm and about 80 nm.

15. The composition of claim 1, wherein the ordered layers have coherence lengths within the layers of at least 2 nm.

16. The composition of claim 1, wherein the ordered layers have coherence lengths within the layers of at least 5 nm.

17. The composition of claim 1, wherein M is Pb, X is Se, and T is Ti or Ta, and an electrical conductivity of the composition is at least 0.04 Ohm-m and a Seebeck coefficient is at least 100 μV/K.

18. The composition of claim 1, wherein X is S.

19. The composition of claim 1, wherein M is one of Sn, Sb, Bi, or a rare earth metal.

20. A layered composition, comprising:
a substrate;
one or more ordered layers conformed to the substrate and having the formula $(MX)_m$, wherein M is Sn, Sb, Bi, Sc, Y, or a lanthanide, and X is Te, Se, or S; and
one or more ordered layers having the formula $(TX_2)_n$, conformed to the substrate and alternating with the one or more ordered layers having the formula $(MX)_m$, wherein T is group 4, 5, or 6 transition metal and wherein m layers of MX alternate with n layers of $TX_2$, wherein m and n are positive integers and m, n >2, and wherein the ordered layers of MX and $TX_2$ are misfit with respect to each other and the ordered layers of MX are disordered with respect to each other and the ordered layers of $TX_2$ are disordered with respect to each other.

21. The layered composition of claim 20, having a thermal conductivity of less than about 0.08 W m$^{-1}$ K$^{-1}$ in a direction perpendicular to an interface between a $TX_2$ layer and an MX layer.

22. The layered composition of claim 20, wherein m is greater than or equal to 2 and n is greater than 2.

23. The layered composition of claim 20, wherein X is S.

24. A layered composition, comprising:
a substrate;
one or more layers conformed to the substrate and having the formula $(MX)_m$, wherein m is a positive integer associated with a number of sublayers, M is Sn, Pb, Sb, Bi, Sc, Y, or a lanthanide, and X is Te, Se, or S; and
one or more layers having the formula $(TX_2)_n$ conformed to the substrate and alternating with the one or more layers having the formula $(MX)_m$, wherein T is group 4, 5, or 6 transition metal, wherein at least one of the one or more layers having the formula $(TX_2)_n$ includes nanoplatelets of $TX_2$.

25. The layered composition of claim 24, wherein T is molybdenum.

26. A method, comprising:
depositing on a substrate one or more ordered layers so as to conform to the substrate and having the formula $(MX)_m$, wherein M is Sn, Sb, Bi, Sc, Y, or a lanthanide, and X is Te, Se, or S;
depositing on the substrate one or more ordered layers having the formula $(TX_2)_n$ so as to conform to the substrate and alternate with the one or more ordered layers having the formula $(MX)_m$, wherein T is group 4, 5, or 6 transition metal and wherein m layers of MX alternate with n layers of $TX_2$, wherein m and n are positive integers and m, n>2, and wherein the ordered layers of MX and $TX_2$ are misfit with respect to each other and the ordered layers of MX are disordered with respect to each other and the ordered layers of $TX_2$ are disordered with respect to each other; and
annealing the deposited layers at a temperature of between about 200° C. and 550° C.

27. The method of claim 26, further comprising selecting layer thicknesses for the ordered layers, and depositing the ordered layers so that the deposited thickness for each of the ordered layers is within about 1% of the selected thickness.

28. The method of claim 26, further comprising alternatingly forming m ordered layers of MX and n ordered layers of $TX_2$, wherein m is greater than or equal to 2 and n is greater than 2.

* * * * *